United States Patent
Wunderlich et al.

(10) Patent No.: US 7,554,834 B2
(45) Date of Patent: Jun. 30, 2009

(54) CONDUCTION CONTROL DEVICE

(75) Inventors: Jörg Wunderlich, Cambridge (GB); Kenchi Ito, Cambridge (GB)

(73) Assignee: Hitachi, Ltd., Tokyo (JP)

( * ) Notice: Subject to any disclaimer, the term of this patent is extended or adjusted under 35 U.S.C. 154(b) by 288 days.

(21) Appl. No.: 11/386,737

(22) Filed: Mar. 23, 2006

(65) Prior Publication Data
US 2006/0215442 A1    Sep. 28, 2006

(30) Foreign Application Priority Data

| Mar. 24, 2005 | (EP) | ................................. 05102430 |
| Mar. 30, 2005 | (EP) | ................................. 05102529 |
| Jul. 14, 2005 | (GB) | ................................. 0514371.4 |

(51) Int. Cl.
*G11C 11/00* (2006.01)

(52) U.S. Cl. .................. 365/158; 365/171; 365/173

(58) Field of Classification Search ................ 365/158, 365/171, 173
See application file for complete search history.

(56) References Cited

U.S. PATENT DOCUMENTS

| 5,936,402 A | 8/1999 | Schep et al. |
| 7,245,523 B2 * | 7/2007 | Ho et al. ...................... 365/158 |
| 2003/0128580 A1 * | 7/2003 | Park et al. .................... 365/158 |

OTHER PUBLICATIONS

"Spintronics: A Spin-based Electronics Vision for the Future" by S.A. Wolf, et al., Science, vol. 294, pp. 1488-1495, 2001.
"Making Nonmagmetic Semiconductors Ferromagnetic" by H. Ohno., Science vol. 281., Aug. 1998. pp. 951-956.
Very Large Magnetoresistance in Lateral Ferromagnetic (Ga,Mn)As Wires with Nanoconstrictions, by C. Rüster, et al. pp. 216602-1-216602-4., The American Physical Society 2003., vol. 91, No. 21.
"Tunneling Anisotropic Magnetoresistance: A Spin-Valve-Like Tunnel Magnetoresistance Using a Single Magnetic Layer" by C. Gould, et al., vol. 93, No. 11, 2004, pp. 117203-1-117203-4.
Lepadatu et al., "Direct Observation of Domain Wall Scattering in Patterned Ni80Fe20 and Ni Nanowires by Current-Voltage Measurements", Physical Review Letters, New York, NY, US, vol. 92, No. 12, Mar. 26, 2004, pp. 127201-1, XP002365712.
Giddings et al., "Large Tunneling Anisotropic Magnetoresistance in (Ga, Mn) As Nanoconstrictions", Physical Review Letters, New York, NY, US, Apr. 1, 2005, pp. 127202-1, XP002365713.

* cited by examiner

*Primary Examiner*—Son Dinh
(74) *Attorney, Agent, or Firm*—Mattingly & Malur, PC

(57) ABSTRACT

A conduction control device comprises a first ferromagnetic region having relatively high coercivity, a second ferromagnetic region having relatively low coercivity and a junction region disposed between the first and second ferromagnetic regions. The device also comprises a gate for applying a field to the junction region so as to control charge carrier density within the junction region.

30 Claims, 14 Drawing Sheets

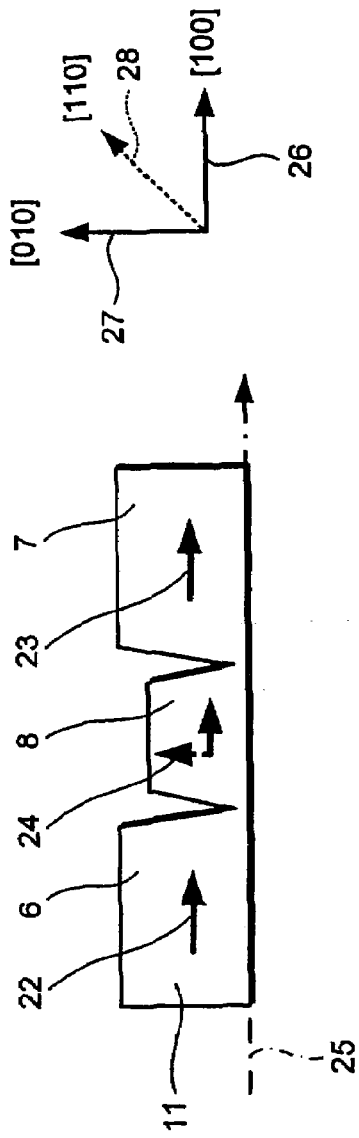
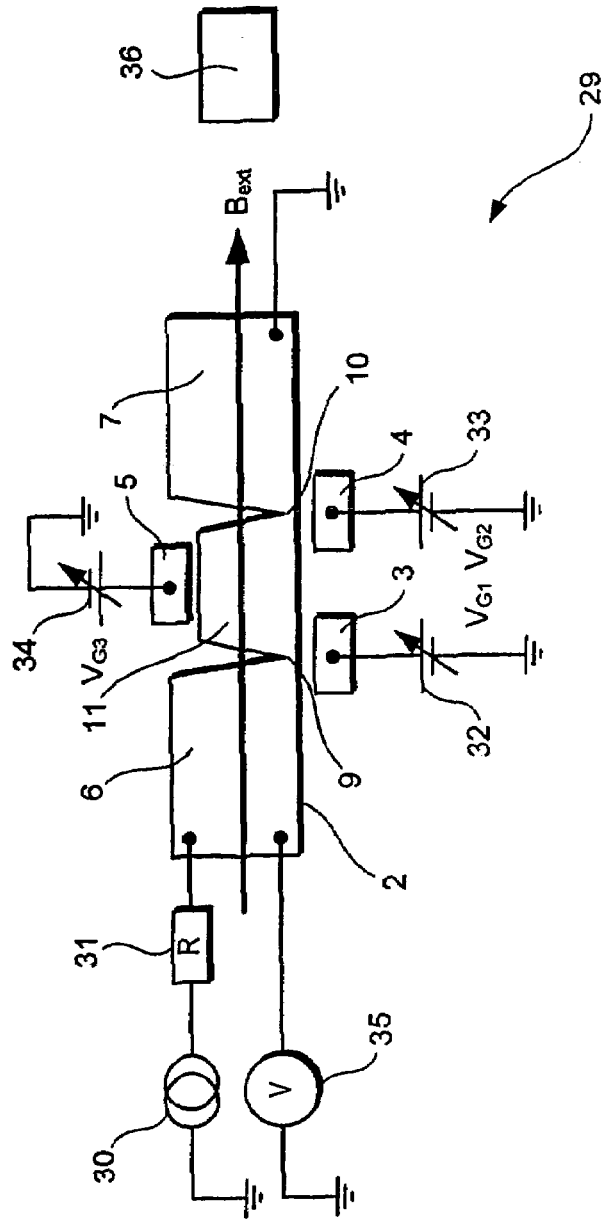

Writing ( or Sensing)

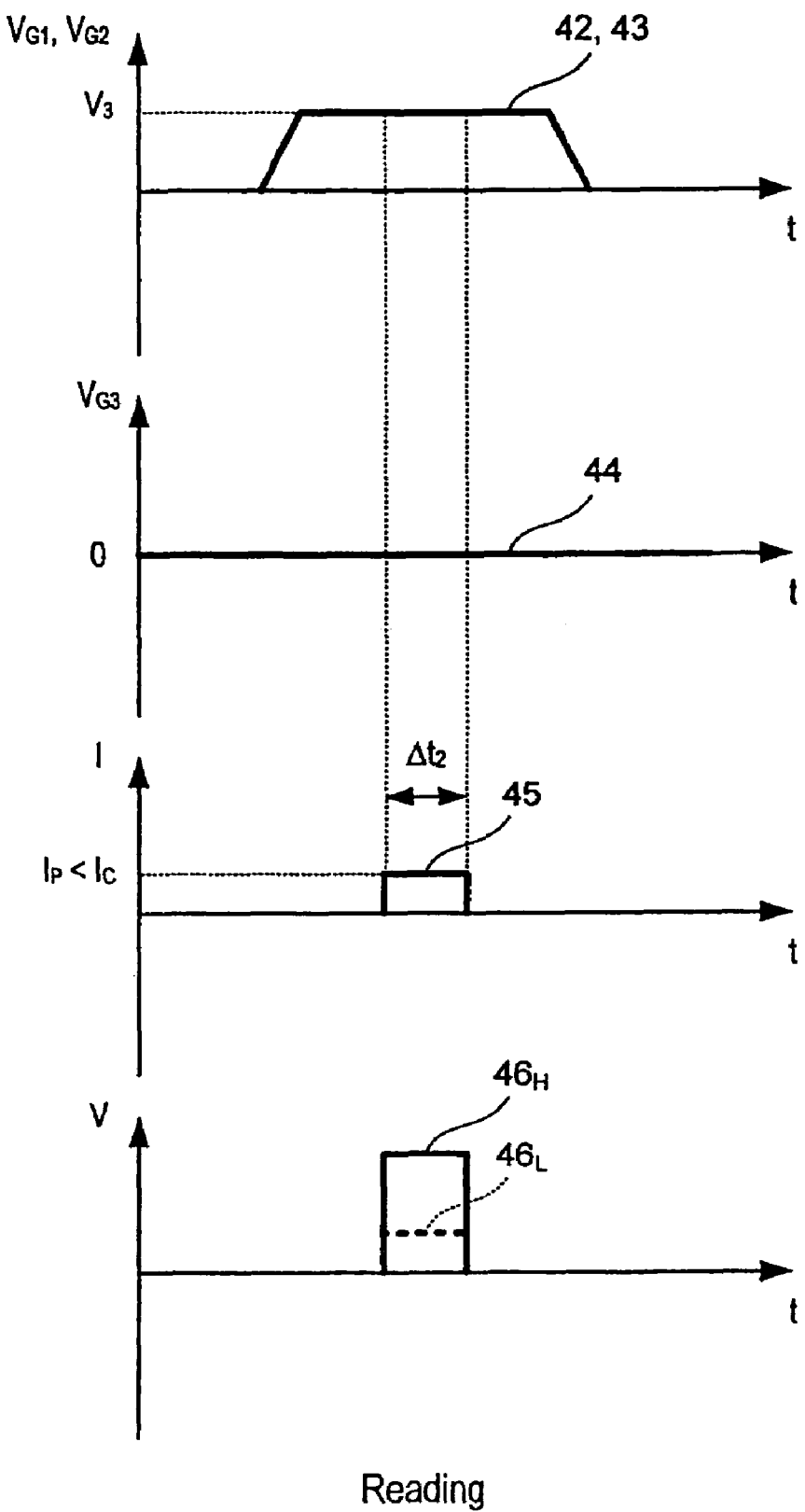

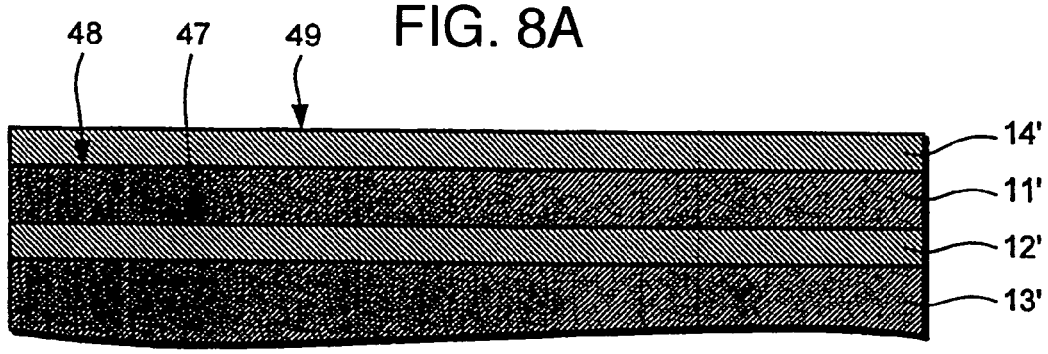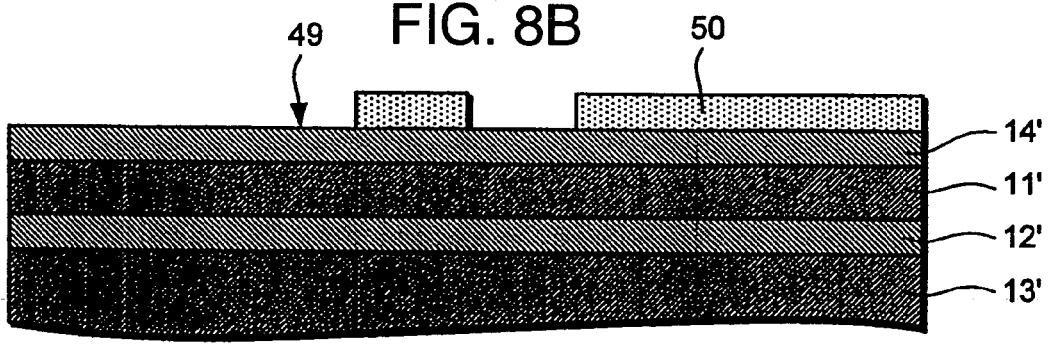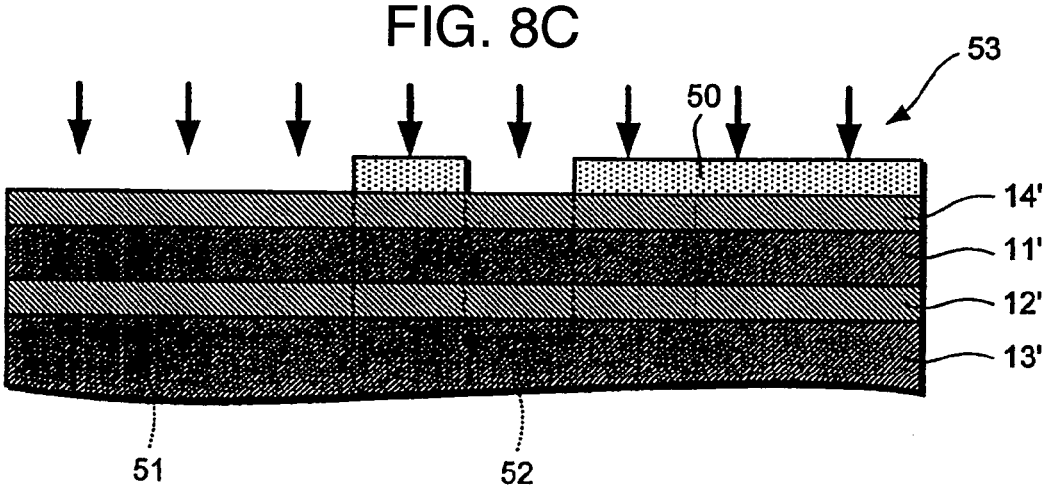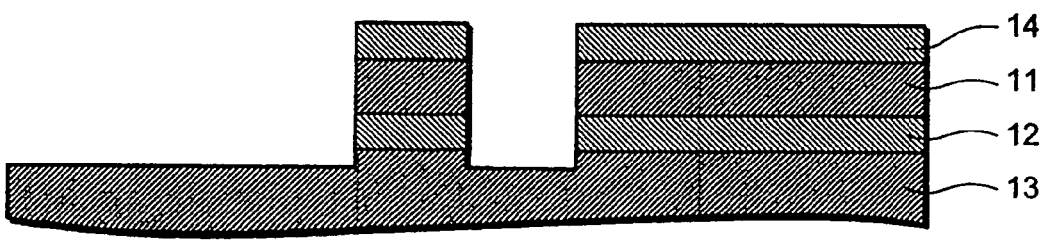

FIG. 14
| A | B | $V_R$ before | $V_R$ after |
|---|---|---|---|
| 0 | 0 | 1 | 1 |
| 0 | 0 | 0 | 0 |
| 1 | 0 | 1 | 1 |
| 1 | 0 | 0 | 0 |
| 0 | 1 | 1 | 1 |
| 0 | 1 | 0 | 0 |
| 1 | 1 | 1 | 0 |
| 1 | 1 | 0 | 1 |
FIG. 15
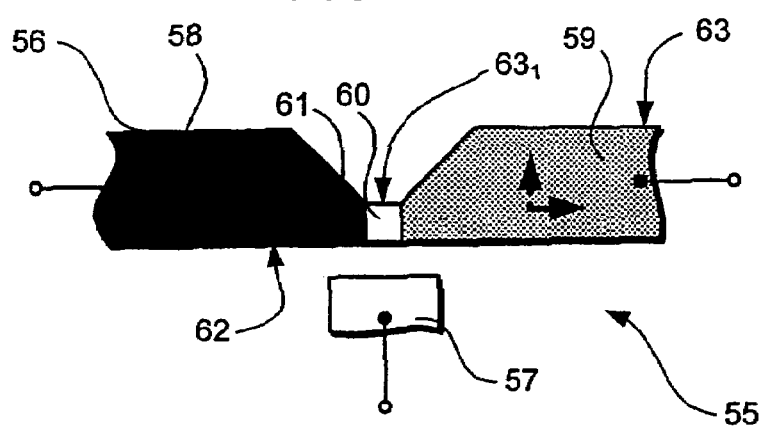
FIG. 17A
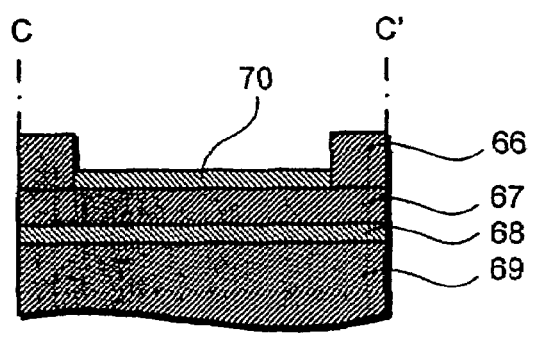
FIG. 17B
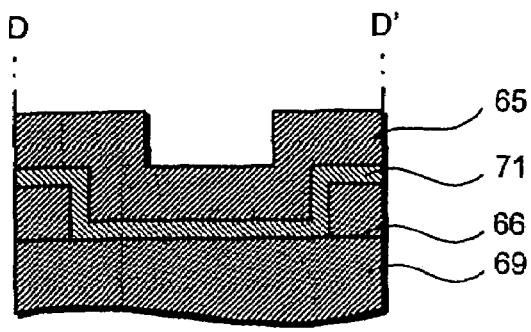

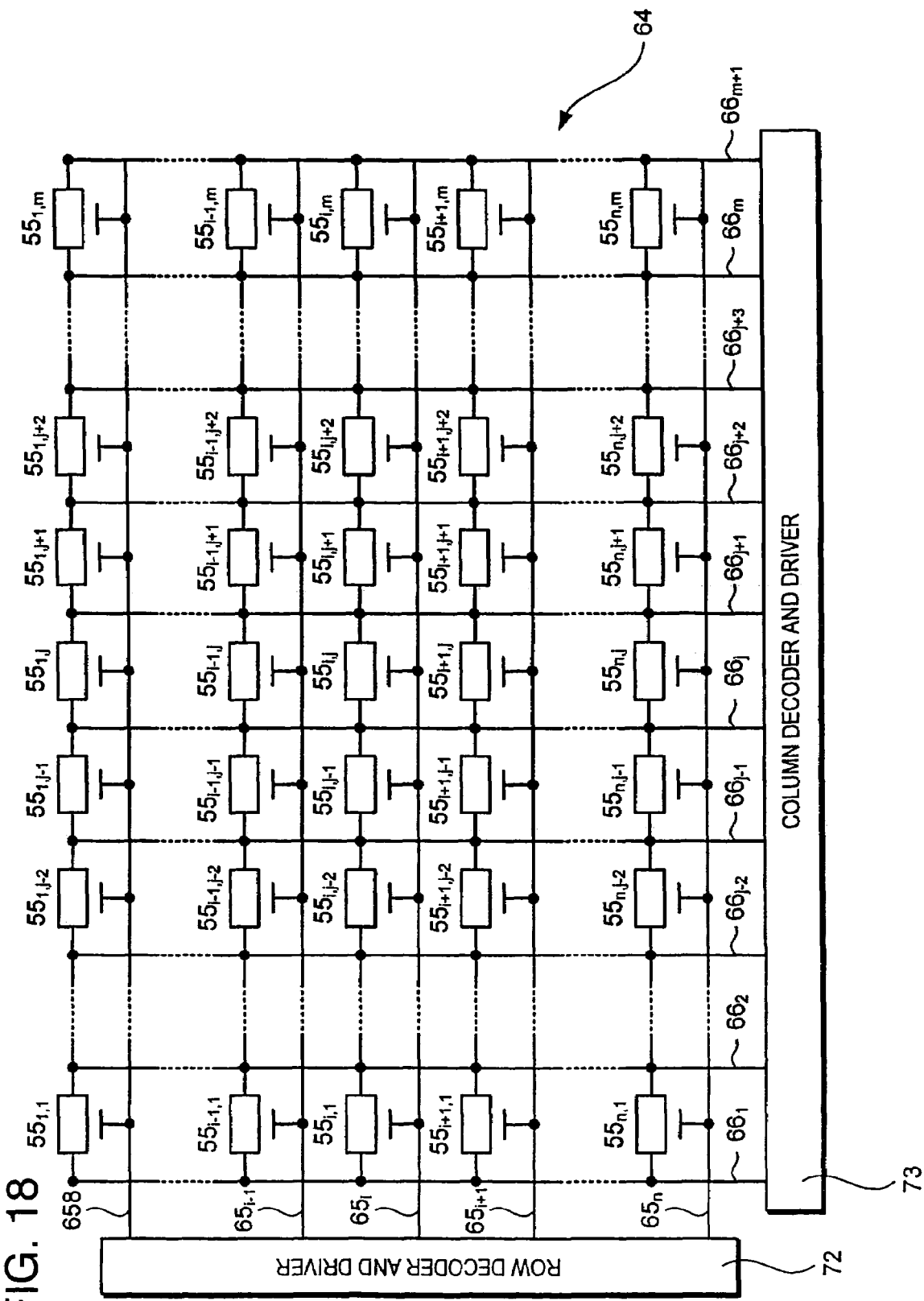

CONDUCTION CONTROL DEVICE

INCORPORATION BY REFERENCE

The present application claims priorities from EP applications EP 05102430.5 filed on Mar. 24, 2005, EP-05102529.4 filed on Mar. 30, 2005, and Great Britain application GB 0514371.4 filed on Jul. 14, 2005, the contents of which are hereby incorporated by reference into this application.

BACKGROUND OF THE INVENTION

The present invention relates to a conduction control device.

New types of electronic devices are emerging in which carrier transport is controlled, at least in part, by charge carrier spin. Well-known examples of these so-called "spintronic" devices include spin valves, based on the giant magnetoresistive effect (GMR), and magnetic tunnel junction (MTJ) devices. Generally, these devices comprise alternating layers of ferromagnetic and non-ferromagnetic material, the non-ferromagnetic material being metallic (in the case of a spin-valve) or insulating (in the case of MTJ device). Spintronic devices have several applications, including magnetic field sensors and magnetic random access memory (MRAM). A review of spin-based electronics and applications is given "Spintronics: A Spin-based Electronics Vision for the Future" by S. A. Wolf et al., Science, volume 294, pp. 1488 to 1495 (2001).

In early spintronic devices, the ferromagnetic material usually comprised a metal, such as iron (Fe), cobalt (Co) or nickel (Ni), or an alloy thereof. However, some, more recent spintronic devices use a ferromagnetic semiconductor, such as gallium manganese arsenide (Ga,Mn)As, which is described in "Making Nonmagnetic Semiconductors Ferromagnetic" by H. Ohno, Science, volume 281, pp. 951 to 956 (1998).

Devices based on ferromagnetic semiconductors have demonstrated strong magnetoresistance effects.

For example, "Very Large Magnetoresistance in Lateral Ferromagnetic (Ga,Mn)As Wires with Nanoconstrictions" by C. Ruster et al., Physical Review Letters, volume 91, p 216602 (2003) describes a structure exhibiting tunnelling magnetoresistance (TMR). The structure is fabricated from a 19 nm-thick layer of $Ga_{0.976}Mn_{0.024}As$ grown on semi-insulating GaAs, which is laterally defined by etching so as to form an island connected to wires on either side by narrow constrictions.

"Tunneling Anisotropic Magnetoresistance: A spin-value like tunnel magnetoresistance using a single magnetic layer" by C. Gould et al., Physical Review Letters, volume 93, p 117203 (2004) describes a device showing spin-valve like effects. The device comprises a pillar consisting of a titanium/gold (Ti/Au) metal contact on an aluminium oxide ($AlO_x$) tunnel barrier disposed on a 70-nm thick layer of $Ga_{0.94}Mn_{0.06}As$ grown on semi-insulating GaAs. The strong anisotropic hysteretic effect in this experimental device can be attributed to tunneling anisotropic magnetoresistance (TAMR) which results from strong spin-orbit coupling in a single ferromagnetic layer.

SUMMARY OF THE INVENTION

The present invention seeks to provide a conduction control device, for example for use in memory and/or logic, or for use as a magnetic sensor.

According to a first aspect of the present invention there is provided a conduction control device comprising a first ferromagnetic region having relatively high coercivity, a second ferromagnetic region having relatively low coercivity, a junction region disposed between the first and second ferromagnetic regions for magnetically decoupling the first and second ferromagnetic regions and a gate for applying an electric field to the junction region so as to control charge carrier density within the junction region.

Thus, the gate can be used for depleting or accumulating charge carriers in the junction region so as to form a tunnel barrier or a conducting channel and so provide read and write states respectively.

The device may comprise a third ferromagnetic region having higher coercivity than the second ferromagnetic region, another junction region disposed between the second and third ferromagnetic regions and another gate for applying a field to the other junction region so as to change charge carrier density within the junction region.

The device may comprise a further gate for applying a field to the second ferromagnetic region. The further gate may be used to increase or decrease charge carrier density in the second ferromagnetic region and, thus, change its magnetic properties, such as coercivity.

The first and second ferromagnetic regions may comprise the same material, which may be a ferromagnetic semiconductor, such as (Ga,Mn)As. The junction region may also comprise the same material. The first and second ferromagnetic regions and the junction region may be formed in a layer.

The first ferromagnetic region may be elongate, having a longitudinal axis. The longitudinal axis may be aligned in a direction along a magnetic easy axis.

The device may be configured to exhibit tunnelling anisotropy magnetoresistance (TAMR) effect and/or tunnelling magnetoresistance (TMR) effect.

The second ferromagnetic region may be provided by a layer or a portion of a layer which is arranged substantially in a plane. The layer or layer portion may have a thickness less than or equal to 10 nm. The second ferromagnetic region may have a magnetic easy axis which is orientated out of the plane of the layer or layer portion and/or a magnetic easy axis which is orientated in the plane of the layer or layer portion. The first ferromagnetic region may be provided by another layer or another portion of the layer which is arranged substantially in the, or another, plane. The first ferromagnetic region may have a magnetic easy axis which is orientated in the plane of the other layer or the other layer portion.

According to a second aspect of the present invention there is provided a device comprising a conductive region, a ferromagnetic region, a junction region for connecting the conductive region and the ferromagnetic region and a gate for applying an electric field to the junction region so as to control charge carrier density within the junction region.

The conductive region may comprise a non-ferromagnetic material or a semiconducting material or non-ferromagnetic, semiconducting material. The junction region may comprises a semiconductor material. The conductive region, the junction region and/or ferromagnetic region may comprise the same material.

According to a second aspect of the present invention there is provided a memory array of conduction control devices.

According to a third aspect of the present invention there is provided a method of fabricating a conduction control device, the method comprising providing a first ferromagnetic region having relatively high coercivity, providing a second ferromagnetic region having relatively low coercivity, providing a junction region disposed between the first and second ferromagnetic regions for magnetically decoupling the first and second ferromagnetic regions; and providing a gate for applying a field to the junction region so as to control charge carrier density within the junction region.

Providing the junction region may comprise defining a constriction between the first and second junction regions.

According to a fourth aspect of the present invention there is provided a method of operating a conduction control device having a channel comprising a first ferromagnetic region having relatively high coercivity, a second ferromagnetic region having relatively low coercivity, a junction region disposed between the first and second ferromagnetic regions for magnetically decoupling the first and second ferromagnetic regions; and a gate for applying an electric field to the junction region so as to control charge carrier density within the junction region, the method comprising applying a first bias to the gate for increasing charge carrier density in the junction region and driving a first current pulse through the channel, the current pulse having a first current amplitude greater than a critical value for reversing magnetisation of the second ferromagnetic region.

This can have the advantage that the magnetisation of the second ferromagnetic region can be selectively reversed without reversing the magnetisation of the first ferromagnetic region.

The method may comprise applying a second bias to the gate for decreasing charge carrier density in the junction region and driving a second current pulse through the channel, the second current pulse having a second current amplitude lower than the critical value.

According to a fifth aspect of the present invention there is provided a method of operating a conduction control device having a channel comprising a first ferromagnetic region having relatively high coercivity, a second ferromagnetic region having relatively low coercivity, a junction region disposed between the first and second ferromagnetic regions for magnetically decoupling said first and second ferromagnetic regions; and a gate for applying a field to the junction region so as to control charge carrier density within the junction region, the method comprising applying a magnetic field to said first and second ferromagnetic regions for reversing magnetization of the second ferromagnetic region, said magnetic field being greater than a critical field of the second ferromagnetic region, but lower than a critical field of the first ferromagnetic region.

This can have the advantage that the magnetisation of the second ferromagnetic region can be selectively reversed without reversing the magnetisation of the first ferromagnetic region.

Embodiments of the present invention will now be described, by way of example, with reference to the accompanying drawings in which:

Other objects, features and advantages of the invention will become apparent from the following description of the embodiments of the invention taken in conjunction with the accompanying drawings.

BRIEF DESCRIPTION OF THE DRAWINGS

FIG. 4 is a schematic illustration of magnetisation of ferromagnetic regions in the device shown in FIG. 1;

FIG. 5 is a schematic diagram of apparatus for operating the device shown in FIG. 1;

FIG. 7 illustrates gate biases and a current pulse which can be applied to the device of FIG. 1 during a read cycle;

FIGS. 8A to 8D show a method of fabricating the device shown in FIG. 1;

FIG. 14 is a truth table for the device shown in FIG. 11;

FIG. 15 is a schematic view of a memory cell in accordance with the present invention;

FIGS. 17A and 17B are cross sections of a memory cell shown in FIG. 15 taken along lines C-C' and D-D' respectively;

FIG. 18 is a schematic diagram of a memory array including driving circuitry;

DESCRIPTION OF THE EMBODIMENTS

Device Structure

Figure 1:
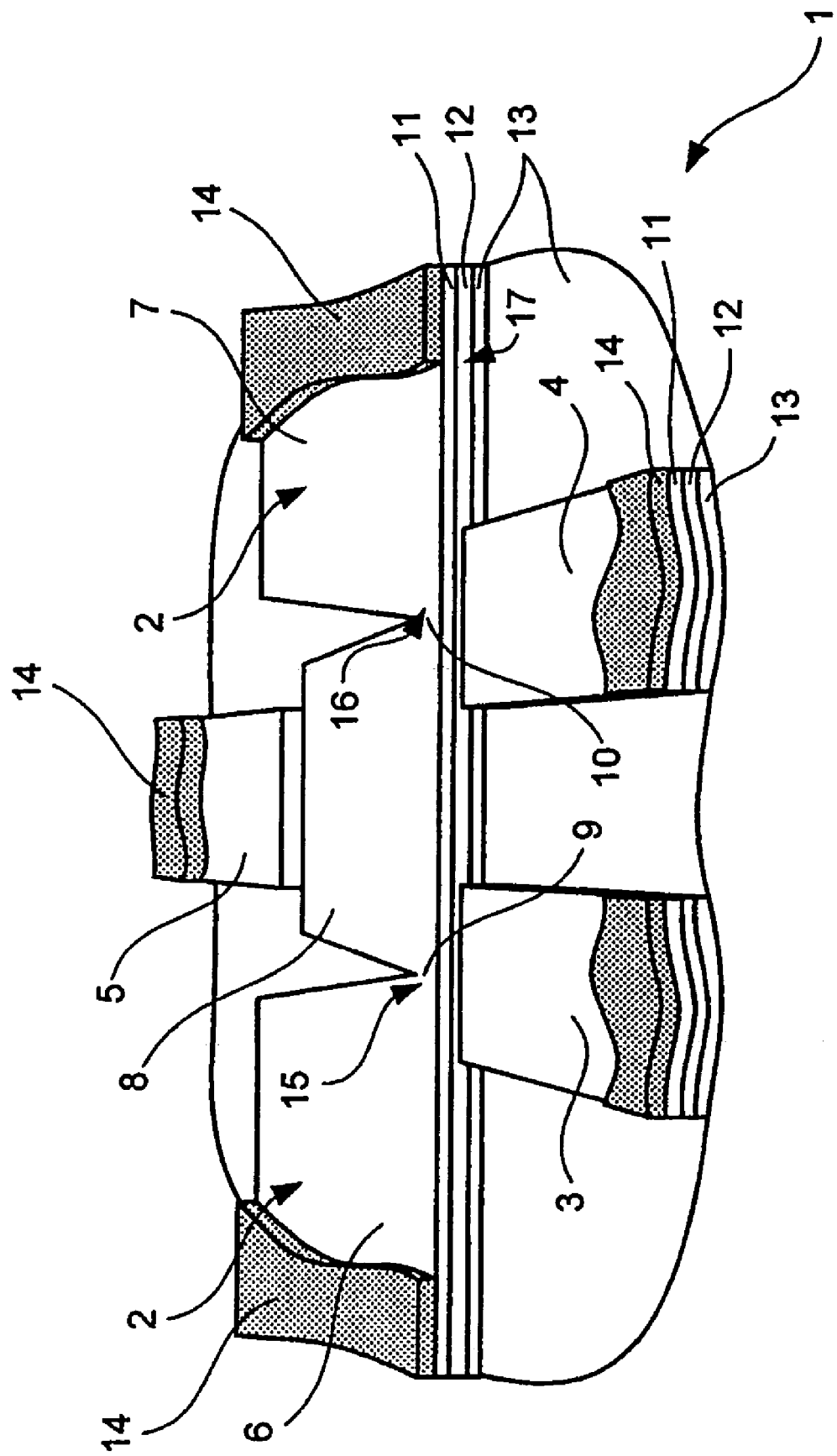
FIG. 1 is perspective view of a conduction control device in accordance with the present invention.
Figure 2:
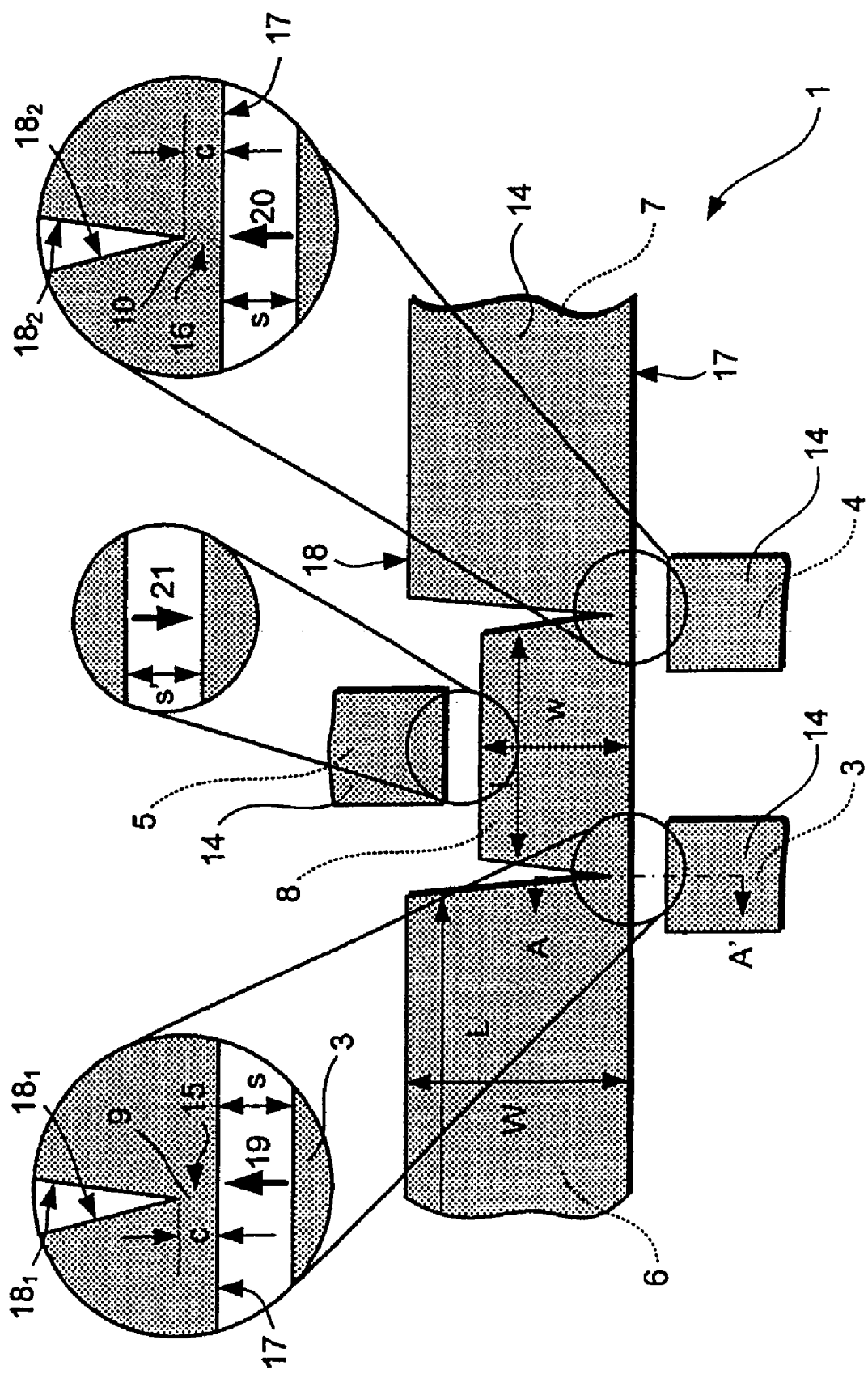
FIG. 2 is a plan view of the device shown in FIG. 1.
Figure 3:
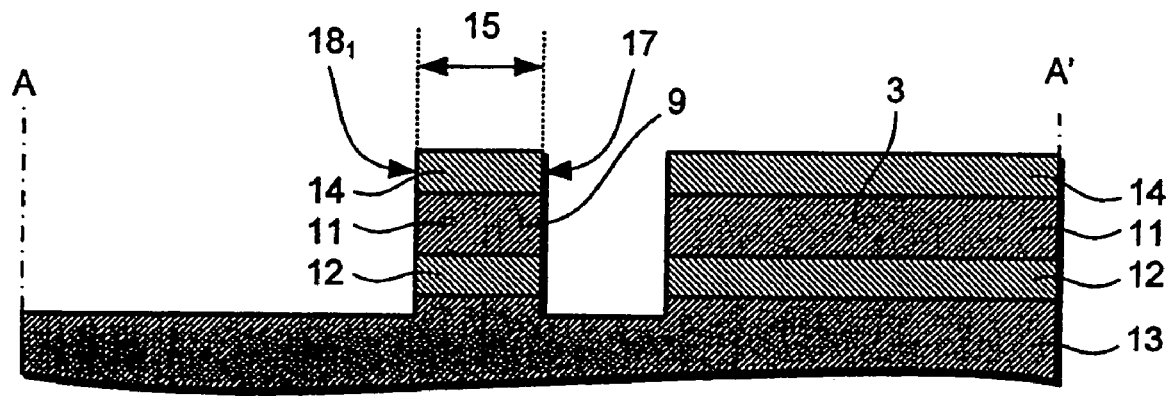
FIG. 3 is a cross section of the device shown in FIG. 2 taken along a line A-A'.

Referring to FIGS. 1, 2 and 3, a conduction control device 1 in accordance with the present invention comprises an elongate conduction channel 2 and first, second and third gates 3, 4, 5.

The channel 2 comprises first and second ferromagnetic regions 6, 7 having relatively high coercivity and a third ferromagnetic region 8 having relatively low coercivity. The third ferromagnetic region 8 is generally disposed between the first and second ferromagnetic regions 6, 7 such that conduction between the first and second ferromagnetic regions 6, 7 occurs through the third ferromagnetic region 8. Thus, the first and second fixed regions 6, 7 also serve as source and drain regions.

The first, second and third ferromagnetic regions 6, 7, 8 are formed from the same ferromagnetic material. However, the first, second and third ferromagnetic regions 6, 7, 8 may be formed from different ferromagnetic materials, such as ferromagnetic metals and ferromagnetic semiconductors. The ferromagnetic semiconductor may comprise a semiconductor which is doped with a magnetic dopant so as to become ferromagnetic and the concentration of the magnetic dopant may be varied. Furthermore, the ferromagnetic semiconductor may be doped with additional, non-magnetic dopant. Alternatively, the ferromagnetic semiconductor may comprise a semiconductor which exhibits ferromagnetism without doping and may be doped with a magnetic or non-magnetic dopant.

The channel 2 includes first and second junctions regions 9, 10. The first junction region 9 magnetically decouples the first ferromagnetic region 6 and the third ferromagnetic region 8 in the sense that that the magnetisation reversal can occur in the first and third regions 6, 8 at different magnetic fields. Likewise, the second junction region 10 magnetically decouples the second ferromagnetic region 7 and the third ferromagnetic region 8. The first and second junctions regions 9, 10 comprise semiconductor material. The first and second junctions regions 9, 10 may be formed from the same material and may be formed from the same material as one or more of the ferromagnetic regions 6, 7, 8.

The ferromagnetic and junction regions 6, 7, 8, 9, 10 are provided in a patterned ferromagnetic layer 11 comprising a ferromagnetic semiconductor, which in this example is a gallium manganese arsenide alloy $(Ga_{1-x}Mn_xAs)$ having a manganese concentration x of 0.02, in other words $Ga_{0.98}Mn_{0.02}As$. However, gallium manganese arsenide alloys having other manganese concentrations, for example x=0.06, may be used. Furthermore, other ferromagnetic semiconductors, such as (In,Mn)As, (Ga,Mn)P, (Ga,Mn)N or $Ge_{1-y}Mn_y$, may be used. In this example, the patterned ferromagnetic layer 11 has a thickness of 10 nm. However, the ferromagnetic layer 11 may be thinner, for example 3 nm or 5 nm, or thicker.

Using a ferromagnetic semiconductor instead of a ferromagnetic metal or alloy can have the advantage that a gate can be used to apply an electric field to the ferromagnetic material and change the density and/or distribution of charge carriers which mediate magnetic order and so alter the magnetic properties of the ferromagnetic material. It can also have the advantage that power consumption is reduced because the critical current density for spin-torque magnetisation reversal in a ferromagnetic semiconductor is usually two to three orders of magnitude lower than in a ferromagnetic metal.

The patterned ferromagnetic layer 11 overlies a coextensive insulating layer 12 comprising an insulator, which in this example is aluminium arsenide (AlAs). Other insulators may be used. The insulator may be crystalline. The insulator may be latticed-matched with the ferromagnetic semiconductor or may be mis-matched with the ferromagnetic semiconductor to achieve strain which helps to cause magnetic anisotropy. The ferromagnetic layer 11 and the insulating layer 12 need not be coextensive. For example, the insulating layer 12 may be larger. The insulating layer 12 overlies a partially etched substrate 13, which in this example comprises semi-insulating gallium arsenide (GaAs). Other substrates, such as silicon, may be used. A capping layer 14 (in FIG. 1 shown partially removed for clarity) coextensively overlies the patterned ferromagnetic layer 11. In this example, the capping layer 14 comprises AlAs. The capping layer 14 and ferromagnetic layer 11 need not be coextensive.

Referring in particular to FIGS. 2 and 3, the third ferromagnetic region 8 and the first and second junction regions 9, 10 are defined by constrictions 15, 16. The constrictions 15, 16 are defined between a first sidewall 17 and first and second portions $18_1$, $18_2$ of a second, opposing sidewall 18. In plan view, each sidewall portion $18_1$, $18_2$ provides an inward notch towards the first sidewall 17. The constrictions 15, 16 may be defined using other sidewall arrangement, for example using other shaped inflections and/or using a pair of opposing inflections. The constrictions 15, 16 may be elongate, for example provided by a narrow conduction channel portion.

The junction regions 9, 10 can be defined in other ways and need not use a constriction. For example, the junction regions 9, 10 may comprise a different material or a material with different doping concentration.

The first and second ferromagnetic regions 6, 7 are generally elongate and have a width W and a length L, such that W<L. The width W may be less than or equal to 100 nm and may be less than or equal to 50 nm. In this example, W is 50 nm and L is 200 nm.

The third ferromagnetic region 8 may be elongate and has a width w and a length l. The width w may be less than W. In this example, w is 40 nm and l is 60 nm.

Magnetic shape anisotropy may be used to lower the coercivity of the third ferromagnetic region 8 relative to the coercivity of the first and second ferromagnetic regions 6, 7, particularly if the ferromagnetic regions 6, 7, 8 comprise the same material. Thus, the third ferromagnetic region 8 may be configured to have a lower coercivity by arranging it to have a different aspect ratio compared with the other ferromagnetic regions 6, 7. The aspect ratio may be defined as the ratio of width to length, i.e. w/l and W/L. Thus, the third ferromagnetic region 8 may have a higher aspect ratio than the first and second ferromagnetic regions 6, 7.

The constrictions 15, 16 each have width c which is less than w. The constriction width c may be less than 20 nm. In this example, the constriction width c is 10 nm.

The constrictions 15, 16 may have different widths. For example, the first constriction 15 may be narrow enough for providing a tunnel barrier for the device 1 to exhibit tunneling anisotropic magnetoresistance (TAMR), whereas the second constriction 16 may be wider, wide enough for not providing a tunnel barrier, or vice versa. Thus, a third magnetic region 8 may be defined, but only one constriction 15, 16 provides a tunnel barrier.

The first and second gates 3, 4 control charge carrier density in the first and second junctions regions 9, 10 respectively for switching the junction regions 9, 10 between conducting and insulating states, preferably ohmic and tunnelling states respectively.

In this example, the first and second gates 3, 4 are generally in plane with and laterally spaced from the junction regions 9, 10 and arranged adjacent to the first sidewall 17 so as to provide a side gating arrangement. Thus, the first and second gates 3, 4 apply respective electric fields 19, 20 through the first sidewall 17 into the first and second junction regions 9, 10. However, other gating arrangements may be used. For example, each side gate 3, 4 may comprise a pair of opposing side gates, which is sometimes referred to as a "split-gate". Each gate 3, 4 may additionally or alternatively comprise a top gate overlying the junction region 9, 10 and/or a back gate underlying the junction region 9, 10. The gates 3, 4 may be separated from the junction regions 9, 10 by a dielectric layer (not shown).

In the side gating arrangement, the first and second gates 3, 4 are spaced from the first and second junction regions 9, 10 respectively by a separation s. The separation s may be less than 20 nm, less than 10 nm or less than 5 nm. In this example, the separation s is 10 nm.

In a top gate and/or side gate arrangement, the separation between the gate 3, 4 and the junction 9, 10 may be defined by the thickness of an intermediate insulator (not shown), for example comprising an amorphous insulating material, such as silicon dioxide ($SiO_2$), silicon nitride ($Si_3N_4$) or an insulating crystalline material, such as AlAs for (Ga,Mn)As. The intermediate insulator preferably should be thick enough to prevent tunnelling or breakdown at least at typical gate voltages. The thickness of the insulator may be less than 20 nm and may be less than 10 nm. The thickness of the insulator may be less than 6 or 5 nm, but above 2 or 3 nm.

Separation may be chosen based on the magnitude of an applied electric field 19, 20 and the breakdown field of the gap between the gate 3, 4 and the junction 9, 10 or the separating insulator (not shown).

The third gate 5 is arranged as a side gate to the third ferromagnetic region 8 to control charge carrier density in the third ferromagnetic region 8 and, thus, alter coercivity. This can have the advantage that it can lower the current and/or the magnetic field needed for magnetisation reversal and, thus, reduce power consumption. It can also have the advantage that it can be used to increase or decrease sensitivity of the device when the device is used as a magnetic field sensor.

The third gate 5 is generally in plane with and laterally spaced from the third ferromagnetic region 8 and arranged adjacent to the second sidewall 18 so as to provide a side gating arrangement. Thus, the third gate 5 applies an electric field 21 through the second sidewall 18 into the third ferromagnetic region 8. However, other gating arrangements may be used. For example, the third gate 5 may comprise a pair of opposing side gates. The third gate 5 may additionally or alternatively comprise a top gate overlying the free region 8 and/or a back gate underlying third ferromagnetic region 8. A top or bottom gate arrangement can have an advantage in that it may be possible to expose a larger area or volume of the third ferromagnetic region 8 to an electric field and, thus, provide greater control over the magnetic properties of the ferromagnetic region 8, such as coercivity. A top gate arrangement is described in more detail later.

In the side gating arrangement, the third gate 5 is spaced from the third ferromagnetic region 8 by a separation s'. The separation s' may be less than 20 nm, less than 10 nm or less than 5 nm. In this example, the separation s' is 10 nm.

In a top gate and/or side gate arrangement, the separation between the gate 5 and the third ferromagnetic region 8 may be defined by the thickness of an intermediate insulator (not shown), for example comprising an amorphous or crystalline insulating material, as mentioned earlier. The thickness of the insulator may be less than 20 nm and may be less than 10 nm. The thickness of the insulator may be less than 6 or 5 nm, but above 2 or 3 nm.

Separation may be chosen based on the magnitude of an applied electric field 21 and the breakdown field of the gap between the gate 5 and the third ferromagnetic region 8 or the separating insulator (not shown).

The gates 3, 4, 5 are provided in the patterned ferromagnetic layer 11 and overlie insulating layer 12 and substrate 13 and underlie capping layer 14.

Instead of the first ferromagnetic region 6, a non-ferromagnetic region may be used, such as a non-ferromagnetic, semiconducting region. The second ferromagnetic region 7 may be omitted or, instead, a non-ferromagnetic region may be used. Devices comprising a conductive region, a ferromagnetic region, a junction region for electrically coupling the conductive region and ferromagnetic region and a gate for controlling charge carrier density within the junction region can be used as a magnetic sensor.

Magnetisation

In this example, the first, second and third ferromagnetic regions 6, 7, 8 are formed from (Ga,Mn)As. Ferromagnetism in (Ga,Mn)As arises as a result of exchange interaction between itinerant holes and localised Mn ions. Thus, changing the density of charge carriers can change the magnetic properties of device 1 and can even suppress magnetic order.

The ferromagnetic regions 6, 7, 8 may each comprise a respective single magnetic domain. A region 6, 7, 8 may be arranged to have a single magnetic domain by configuring the region 6, 7, 8 to have a dimension smaller than a given size, typically of the order of 1 to 10 μm.

Referring to FIG. 4, a schematic diagram of the first, second and third ferromagnetic regions 6, 7, 8 and their respective magnetisations 22, 23, 24 is shown.

The first, second and third ferromagnetic regions 6, 7, 8 are magnetized in the plane of the layer 11 and have respective magnetisations 22, 23, 24. However, one or more of the ferromagnetic regions 6, 7, 8 can be magnetized out of the plane of the layer 11, for instance perpendicularly to the plane of the layer 11. For example, the first and second ferromagnetic regions 6, 7 may be magnetised in the plane of the layer 11, whereas the third ferromagnetic region 8 may be magnetised out of the plane of the layer 11 or vice versa.

A thin film of (Ga,Mn)As grown on GaAs experiences compressive strain due to lattice mismatch and exhibits, at low temperatures (in this case, below about 4.2° K), bi-axial anisotropy having easy axes along the [100] and [010] crystallographic directions. Thus, ordinarily, magnetizations aligned along the [100], [010], [−100] or [−010] crystallographic directions each have the same anisotropy energy.

However, further anisotropies can be introduced, for example by shape or strain, which can cause the easy axes to move and/or break the 4-fold degeneracy and so make alignment of along one easy axis energetically preferably to another easy axis.

The third ferromagnetic region 8 is elongate along a longitudinal axis 25 so as to introduce shape anisotropy. The first and second ferromagnetic regions 6, 7 may also be elongate along axis 25. In this example, the longitudinal axis 25 is aligned along a [100] crystallographic direction 26. However, the longitudinal axis 25 may be aligned along a [010] crystallographic direction 27.

At higher temperatures, close to the Curie temperature, (Ga,As)Mn grown on GaAs also exhibits a uni-axial anisotropy having an easy axis along the [110] crystallographic direction. Thus, the longitudinal axis 25 may be aligned along a [110] crystallographic direction 28.

The easy axes can be configured to be in an out-of-plane direction. Out-of-plane anisotropy in GaMnAs can be achieved by introducing tensile strain into a film of GaMnAs, for example by growing the GaMnAs film on InGaAs, or by lowering the density of holes in the GaMnAs film grown on GaAs. Thus, by applying an electric field to the third ferromagnetic region 8 using the third gate 5, the third ferromagnetic region 8 can selectively exhibit out-of-plane magnetic anisotropy, while the first and second ferromagnetic regions 6, 7 still exhibit in-plane magnetic anisotropy. This can result in larger TAMR effects.

If a different ferromagnetic material is used, then the magnetic easy axes may be different.

In this example, the easy axes are in the plane of the layer 11. When no external magnetic field or current is applied, magnetisations 22, 23, 24 are aligned along one of the magnetic easy axes 26, 27. However, if an external magnetic field is applied in a direction different from the direction of magnetisation, then the direction of magnetisation 22, 23, 24 can switch from one easy axis 26, 27 to another 26, 27. Furthermore, if a strong enough current is applied so as to exert a spin-torque, then the direction of magnetisation 24 can switch from one easy axis 26, 27 to another 26, 27.

As shown in FIG. 4, a higher resistance state occurs when the magnetisation 24 is aligned with one of the magnetic easy axes 26, 27. In this example, a relatively low resistance state occurs when the magnetisation 24 lies along the first easy axis 26, i.e. along the [100] crystallographic direction, and relatively high resistance state arises when the magnetisation 24 lies along the second easy axis 27, i.e. along the [010] crystallographic direction.

In this example, the longitudinal axis 25 of the device is aligned in the [100] crystallographic axis 26. When magnetisation 24 of the third ferromagnetic region 8 is aligned along [100] direction, parallel to current flow, the device is in a low resistance state. When magnetisation is aligned along [010] direction, perpendicular to current flow, the device 1 is in a high resistance state.

Although the device 1 can take advantage of the TAMR effect, it need not do so. Instead, the device 1 may make use of other effects, such as the tunnelling magnetoresistance effect (TMR) in which device resistance depends on the direction of magnetization 24 of the third ferromagnetic region 8 relative to the direction of magnetization 22, 23 of the first and second ferromagnetic region 6, 7.

Even though the ferromagnetic regions 6, 7, 8 are formed from the same material, the third ferromagnetic region 8 can be configured to have a lower coercivity, for example by selectively shaping the third ferromagnetic region 8 to have a given geometry, in this case by being less elongate. Additionally or alternatively, other techniques of lowering coercivity may be used, for instance thinning the region 8 by etching or introducing damage in the free region 8 by ion implantation or a combination thereof.

Because the third ferromagnetic region 8 has a lower coercivity than the first and second regions 6, 7, reversal of its magnetisation 24 occurs at a lower critical magnetic field than reversal of magnetisations 22, 23 of the other two ferromagnetic regions 6, 7. Thus, a magnetic field can be applied which is above the critical field of the third ferromagnetic region 8, but which falls below the critical field of the first and second ferromagnetic regions 6, 7. When such as field is applied, the magnetization 24 of the third ferromagnetic region 8 can be switched, while the magnetizations 22, 23 of the first and second ferromagnetic regions 6, 7 remain orientated in the same respective directions. This behaviour can be exploited such that, during normal operation, the first and second ferromagnetic regions 6, 7 provide regions with fixed-direction magnetisation 22, 23, while the third ferromagnetic region 8 provides a region with a reversible-direction magnetisation 24. Thus, the first and second ferromagnetic regions 6, 7 may be each referred to as a "fixed" or "pinned" region and the third ferromagnetic region 8 may be known as a "free" region. For convenience, the first and second ferromagnetic regions 6, 7 are hereinafter referred to as the first and second fixed regions 6, 7 and the third region 8 is hereinafter referred to as a free region 8.

As mentioned earlier, if a strong enough current is applied, then the direction of magnetisation 24 can switch from one easy axis 26, 27 to another 26, 27. This may be because spin-torque action on a magnetic domain wall which causes the wall to move through the free region 8.

The magnetisations 22, 23 of the first and second fixed regions 6, 7 are aligned in the same direction. This may be achieved by applying a magnetic field above the critical field of the first and second fixed regions 6, 7.

The device 1 can have several advantages over conventional spintronic devices.

For example, conventional spintronic devices usually take the form of vertical stacks comprising complex multilayer arrangements, in which layers have fixed functions. However, the device 1 may be considered to be a simpler arrangement in which different parts of the device 1 can have different functions and be tuned. For example, the junction regions 9, 10 can function as tunnel barriers, provide domain wall pinning and/or serve as nucleation regions for domain walls. The magnetic properties of the third ferromagnetic region 8, such as magnetic anisotropy and coercivity, can be varied.

Device Operation

Referring to FIG. 5, apparatus 29 for operating the conduction control device 1 includes a current source 30 for driving a current pulse I through the channel 2 and an optional series resistor 31, first, second and third voltage sources 32, 33, 34 for applying first, second and third gate voltages $V_{G1}$, $V_{G2}$, $V_{G3}$ to the first, second and third side gates 3, 4, 5 respectively and a voltmeter 35 for measuring the voltage drop $V_{SD}$ between the first and second fixed regions 6, 7 and, thus, determine whether the device 1 is in a high or low resistive state.

A source 36 for generating a magnetic field $B_{ext}$ may also be provided. The source 36 may comprise inductor (not shown), such as a wire, loop or coil, and source (not shown) for driving a current through the inductor. The inductor (not shown) may be disposed on the substrate 13 (FIG. 1) close to the device 1 (FIG. 1).

The device 1 can be used to store data and/or to sense a magnetic field.

A process of writing and reading data to and from the device 1 will now be described with reference to FIGS. 5 to 7.

The device 1 is cooled to below the Curie temperature, $T_C$, of the ferromagnetic material. In this example, the Curie temperature of $Ga_{0.98}Mn_{0.02}As$ around 48° K and device is cooled to 4.2° K. Other ferromagnetic materials may have a higher Curie temperature and so devices based on these materials can be operated at a higher temperature.

Figure 6:
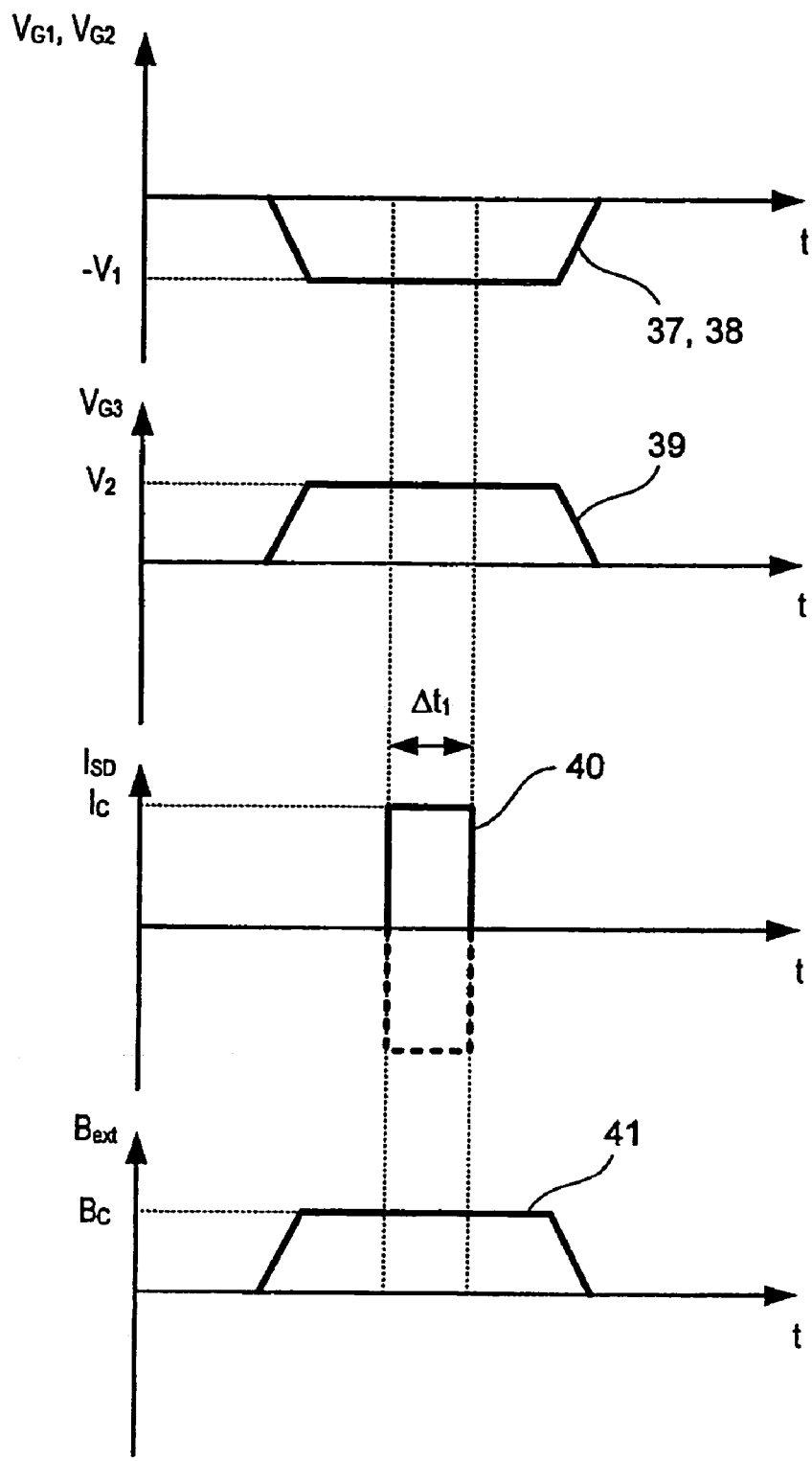
FIG. 6 illustrates gate biases, current pulses and a magnetic field which can be applied to the device of FIG. 1 during a write cycle.

Referring particularly to FIG. 6, in a writing process, the first and second voltages sources 32, 33 may each apply a bias 37, 38 to the first and second gates 3, 4, i.e. $V_{G1}=V_{G2}=-V_1$, so as to increase charge carrier density in the junctions regions 9, 10, thus reducing the resistance of the junctions regions 9, 10 so that they conduct, preferably as ohmic conductors. The junctions 9, 10 are sufficiently conductive so as to exhibit current-induced magnetisation reversal.

In this example, $|V_{G1}|$ and $|V_{G2}|$ are of the order of 1 V. However, these can be found by routine experimentation.

In (Ga,Mn)As, charge carrier transport is hole-dominated. Thus, a negative bias is applied to the first and second gates 3, 4 to increase charge carrier density in the junctions regions 9, 10. If, however, a ferromagnetic semiconductor is used in which charge carrier transport is electron-dominated, then a positive bias is applied to the gates 3, 4.

The third voltage source 34 may apply a bias 39 to the third gate 5, i.e. $V_{G3}=V_2$, so as to decrease charge carrier density on the ferromagnetic island 8 and, thus, reduce coercivity.

In this example, $|V_{G3}|$ is of the order of 1 V. However, this can be found by routine experimentation.

The current source 30 drives a current pulse 40 having a magnitude $I_C$, i.e. $I_{SD}=I_C$, which is higher than the critical current of the ferromagnetic island 8. The current pulse either reinforces the existing magnetisation 24 (FIG. 4) or reverses the magnetisation 24 (FIG. 4), for example by switching the magnetisation by 90°. A given direction of magnetisation 24 can be achieved by selecting the polarity of the current pulse. The current pulse 40 has a duration $\Delta t_1$. The duration $\Delta t_1$ may be less than or equal to 100 ns, 10 ns or 1 ns. In this example, the duration $\Delta t_1$ is 100 ps.

For a ferromagnetic metal, a typical critical current density is of the order of $10^7$ Acm$^{-2}$ and, for a ferromagnetic semiconductor, a typical critical current density is of the order of $10^4$ or $10^5$ Acm$^{-2}$. However, the magnitude and the minimum duration of the current pulse 40 necessary to reverse magnetization can be found by routine experimentation, for example by driving current pulses with increasing higher current densities and/or shorter durations, and measuring resistance.

The magnetic field source 36 may apply a magnetic field pulse 41 to assist the current pulse 40. However, the magnetic field source 36 may apply a constant magnetic field to bias the free region 8. Thus, a current pulse 40 with a lower magnitude can be used to reverse magnetization. The magnetic field source 36 may be an inductive source or may be a permanent magnet.

Referring particularly to FIG. 7, in a reading process, the first and second voltages sources 32, 33 may each apply a bias 42, 43 to the first and second gates 3, 4, i.e. $V_{G1}=V_{G2}=V_3$, so as to deplete charge carrier from the junctions regions 9, 10, preferably to form tunnel barriers. Forming at least one tunnel barrier has an advantage that the device 1 can use the TAMR effect, which has a high magnetoresistance. In this example, because transport is dominated by holes, a positive bias is applied to decrease charge carrier density in the junctions regions 9, 10.

In this example, $V_3$ is of the order of 1 V. However, the bias needed to deplete charge carrier from the junctions regions 9, 10 can be found by routine experimentation, for example by increasing the gate biases and measuring source-drain characteristics.

The third voltages source 34 either applies zero bias 44 to the third gate 5, i.e. $V_{G3}=0$, or lets the third gate 5 float.

The current source 30 drives a measurement or probe current pulse 45 having a magnitude $I_P$, i.e. $I_{SD}=I_P<I_C$, which is lower than the critical current of the ferromagnetic island 8. The current pulse 40 has a duration $\Delta t_2$. The probe pulse may be longer than the write pulse, in other words $\Delta t_2 > \Delta t_1$, may be approximately the same duration, i.e. $\Delta t_2 \approx \Delta t_1$, or may be shorter than the write pulse, i.e. $\Delta t_2 < \Delta t_1$. The duration may depend upon the RC value of the device 1 and/or the sensitivity of the voltmeter 36. The duration $\Delta t_2$ may be less than or equal to 100 ns, 10 ns or 1 ns. In this example, the duration $\Delta t_2$ is 1 ns.

The magnitude of $I_P$ can be made as low as possible, while still making a voltage measurement possible. A value of $I_P$ can be determined by routine experiment.

As the probe current pulse 45 is driven through the device 1, a voltage drop develops across the device 1 which is measured by the voltmeter 35.

If the device 1 is in a high resistance state, then a relatively large pulse $46_H$ corresponding to a relatively high voltage drop will be measured. If the device is in a low resistance state, then a relatively small pulse $46_L$ corresponding to a relatively low voltage drop will be measured.

Device Fabrication

Referring to FIGS. 8A to 8D, a method of fabricating the device 1 will now be described.

Referring to FIG. 8A, a wafer of semi-insulating (001)-orientated GaAs is used as a substrate 13' and is loaded into molecular beam epitaxy (MBE) system (not shown).

A layer 12' of undoped AlAs is grown on the substrate 13' by MBE in a conventional manner. The AlAs layer 12' has a thickness of 10 nm. However, the AlAs layer 12' may be thinner, for example 5 nm, or it may be thicker, for example between 20 and 50 nm.

A layer 11' of $Ga_{0.98}Mn_{0.02}As$ is grown on the AlAs layer 12' by low-temperature MBE, for example as described by R. Campion, Journal of Crystal Growth, volume 247, p 42 (1303). The $Ga_{0.98}Mn_{0.02}As$ layer 11' has a thickness of 10 nm. However, the $Ga_{0.98}Mn_{0.02}As$ layer 11' may be thinner, for example 5 nm, or may be thicker. The $Ga_{0.98}Mn_{0.02}As$ layer 11' may be doped, for example with a p-type dopant, such as Beryllium (Be).

As explained earlier, other ferromagnetic materials may be used. In particular, other ferromagnetic semiconductors may be used.

The AlAs layer 12' helps to electrically insulate the $Ga_{0.98}Mn_{0.02}As$ layer 11' from the substrate 13' and to provide a sharp lower interface 47 to the $Ga_{0.98}Mn_{0.02}As$ layer 11'.

A layer 14' of AlAs is grown on the $Ga_{0.98}Mn_{0.02}As$ layer 11' by MBE. The thickness of the capping layer is 5 nm. The capping layer 14' helps to limit oxidation of the $Ga_{0.98}Mn_{0.02}As$ layer 11' and also to provide a sharp, upper interface 48 to the $Ga_{0.98}Mn_{0.02}As$ layer 11'.

Carrier concentration within the $Ga_{0.98}Mn_{0.02}As$ layer 11' may be increased using modulation doping. For example, the insulating AlAs layer 12' or the capping layer 14' may be doped, for example with a p-type dopant, such as Be. Additionally or alternatively, an additional layer (not shown) comprising, for example GaAs, AlGaAs or AlAs, may be provided immediately under or over the ferromagnetic semiconductor which is doped for increasing charge carrier density.

The wafer comprising the substrate 13' and having overlying deposited layers 11', 12', 14' is removed from the reactor (not shown) and processed. This may include dividing up the wafer into smaller chips.

Mesa structures (not shown) for electrically isolating different areas of the wafer (or chip) and leads (not shown) for electrically contacting the device 1 to bondpad regions (not shown) can be defined using optical lithography and wet etching in a well-known manner. A device can be fabricated in an isolated area, as will now be described:

Referring to FIG. 8B, a layer (not shown) of electron-beam resist in the form of polymethylmetacrylate (PMMA) is applied to an upper surface 49 of the capping layer 14'. The wafer (or chip) is loaded into an electron beam lithography system (not shown) for exposure. The pattern comprises a negative image of the pattern shown in FIG. 2.

The wafer (or chip) is removed from the electron beam lithography system (not shown) and developed using an water and isopropanol (IPA)-based developer so as to remove exposed areas of resist (not shown) and leave a patterned resist layer 50 as an etch mask.

Referring to FIG. 8C, the wafer (or chip) is placed in a reactive ion etching (RIE) system (not shown). Unmasked portions 51, 52 of layers 11', 13', 14' are dry etched using an anisotropic silicon tetrachloride ($SiCl_4$) etch 51. In this example, the etch 51 extends into the substrate 13'. Other RIE etches, such as $Cl_2$, may be used. Other dry etching methods, such as ion beam milling, may be used. Additionally or alternatively, wet etches may be used.

The wafer (or chip) is removed from the RIE system (not shown) and the patterned resist layer 50 may be removed using acetone. The corresponding structure is shown in FIG. 8D.

Additional process steps may include introducing damage into the free region 8 (FIG. 2). This may comprise opening a window (not shown) over the free region 8 (FIG. 2) in an electron-beam resist layer (not shown) and globally scanning an ion beam over the device 1 (FIG. 1). Alternatively, the process may comprise selectively scanning an ion beam (not shown) over the free region 8 (FIG. 2).

The Curie temperature of the ferromagnetic material may be increased by annealing, for example as described by Edmonds et al., Physical Review Letters, 92, p. 037201 (2004).

As mentioned earlier, in some embodiments, a non-ferromagnetic region may be used instead of the first ferromagnetic region 6.

A device comprising a conductive region and a ferromagnetic region may be fabricated by depositing a first layer of material, such as a ferromagnetic semiconducting material, patterning the first layer, for example to form the third ferromagnetic region, then depositing a second layer of material, for example a non-ferromagnetic semiconducting material, which may overlap the patterned first layer, and patterning second layer, for example to form the non-ferromagnetic region. The junction region is provided by at least an interfacial region between the first and second materials.

A device comprising a conductive region and a ferromagnetic region may be fabricated by depositing a layer of material and selectively implanting impurities to form regions of a given type. For example, a method of fabrication may comprise depositing a layer of non-ferromagnetic material, such as GaAs, and selectively implanting a magnetic dopant, such as Mn, to form the third ferromagnetic region. Alternatively, a method of fabrication may comprise depositing a layer of ferromagnetic material, such as (Ga,Mn)As, and selectively implanting a dopant, such as Si, to damage the ferromagnetic region and/or to provide a compensated semiconductor and thus form a non-ferromagnetic region in the place of the first ferromagnetic region. The junction region is provided by at least an interfacial region between the implanted and un-implanted regions.

Alternative Gating Structure

Figure 10:
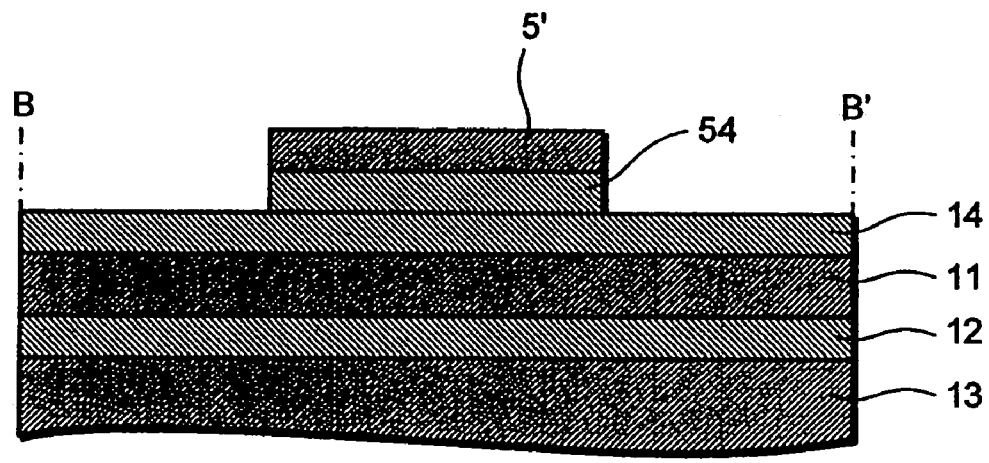
FIG. 10 is a cross section of the device shown in FIG. 9 taken along the line B-B'.
Figure 9:
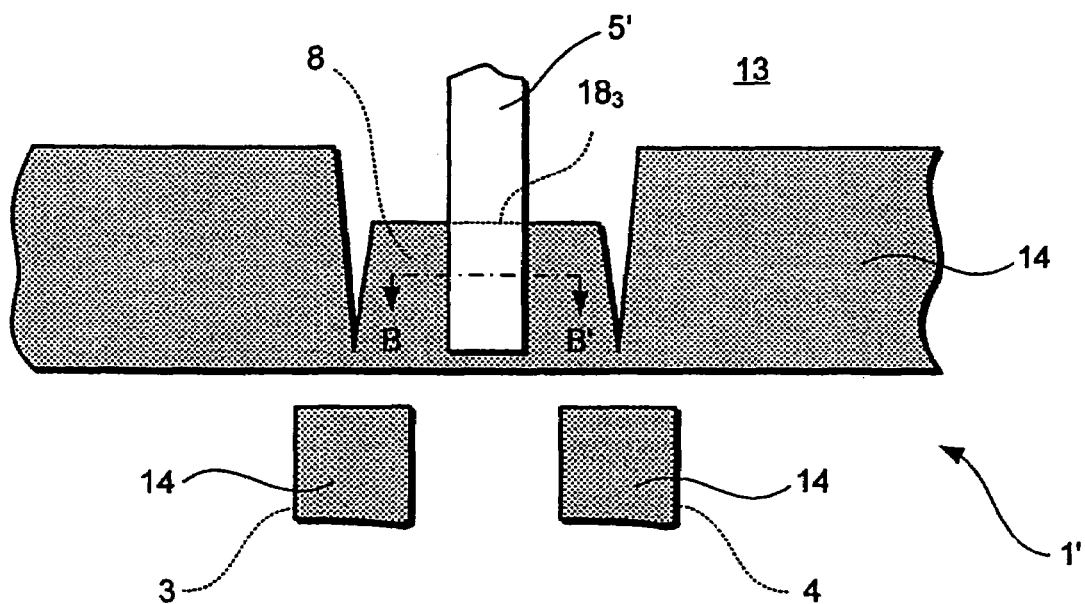
FIG. 9 is a plan view of another conduction control device in accordance with the present invention.

Referring to FIGS. 9 and 10, a modified device 1' is similar to the device 1 (FIG. 1) described earlier except that the side gate 5 (FIG. 1) is replaced by a top gate 5' overlying the capping layer 14 in an area over the free region 8. The top gate 5' comprises a non-ferromagnetic conductor, such as a metal or semiconductor.

In this example, the top gate 5' runs from the etched substrate 13 on to the capping layer 14. An additional insulting layer 54 is deposited before the non-ferromagnetic conductor 5' is deposited so as to insulate the ferromagnetic region 8 from the conductor 5' as it runs up sidewall portion 183. However, a separate, side-insulating layer (not shown) may be provided up the sidewall portion 183. Thus, the additional insulting layer 54 may be omitted.

Other gating arrangements may be used. For example, an underlying bottom gate may be used.

Logic Gate

In conventional microprocessors, logic gates do not usually store data that they have output. Thus, once a logic gate or set of logic gates has performed a logic operation and provided an output, the output is usually stored in separate memory. The additional step of storing the output hinders computational performance.

In contrast, the device 1 not only can operate as a logic gate, but also can store the output of the operation without the need for storing the output in separate memory.

Figure 11:
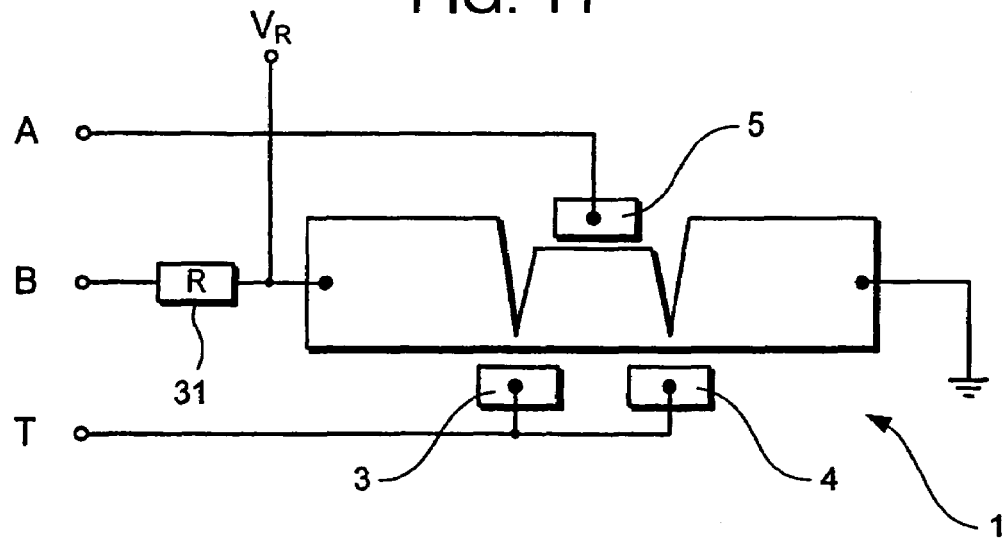
FIG. 11 illustrates the device shown in FIG. 1 being used as a logic gate.

Referring to FIG. 11, the device 1 shown in FIG. 4 is presented in terms of a logic gate having inputs A, B and T and an output $V_R$.

Input A is operatively connected to the third gate 5 and controls magnetization reversal. Input B is operatively connected to the resistor 31 for driving writing or reading current pulses through the resistor 31 and the device 1. Input T is operatively connected to the first and second gates 3, 4 for setting the device 1 for writing or reading. An output $V_R$ is taken between the device 1 and the resistor 31.

In this example, inputs A, B, T are provided by sources 30, 32, 33, 34 (FIG. 5). However, the inputs may be provided by other logic gates (not shown) or control elements (not shown).

Figure 12:
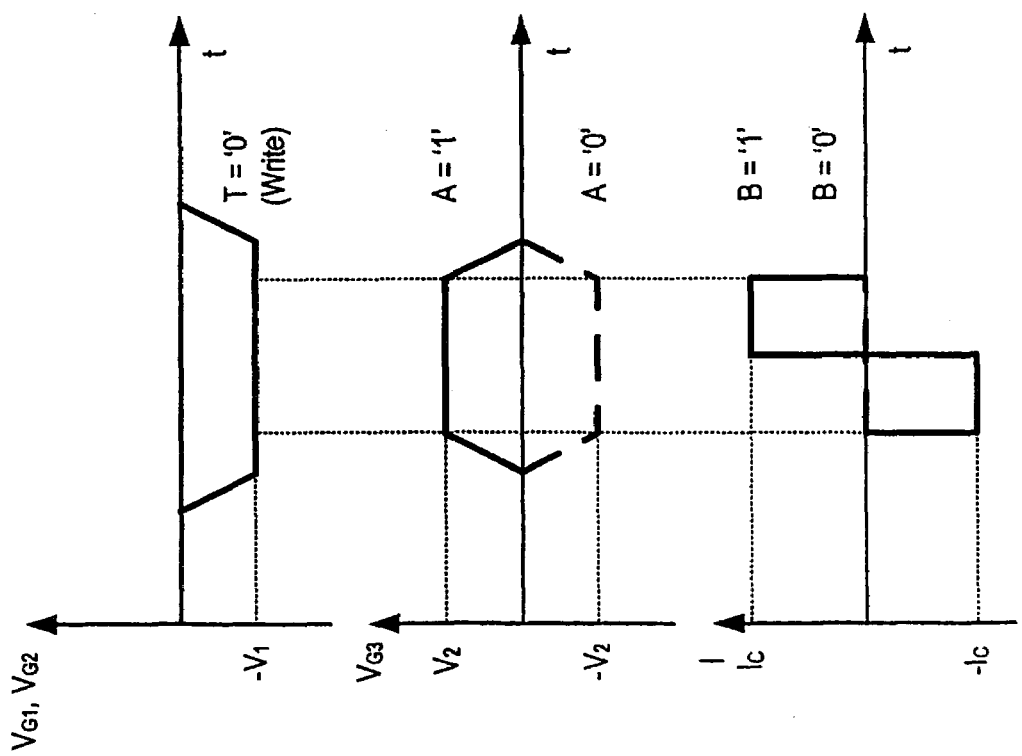
FIG. 12 illustrates gate biases, current pulses and a magnetic field which can be applied to the device of FIG. 1 during a write cycle.

Referring to FIG. 12, to switch the device 1 into a "write" state, an input T=0 is applied. This is achieved by supplying $V_{G1}=V_{G2}=-V_1$ to the first and second gates 3, 4, as described earlier.

An input A=0 or A=1 is applied by supplying $V_{G3}=V_2$ or $V_{G3}=-V_2$ respectively to the third gate 5.

An input B=0 or B=1 is applied by applying no current pulse or applying a double pulse having magnitude $I_C$ through the device 1, in a similar way to that described earlier.

Figure 13:
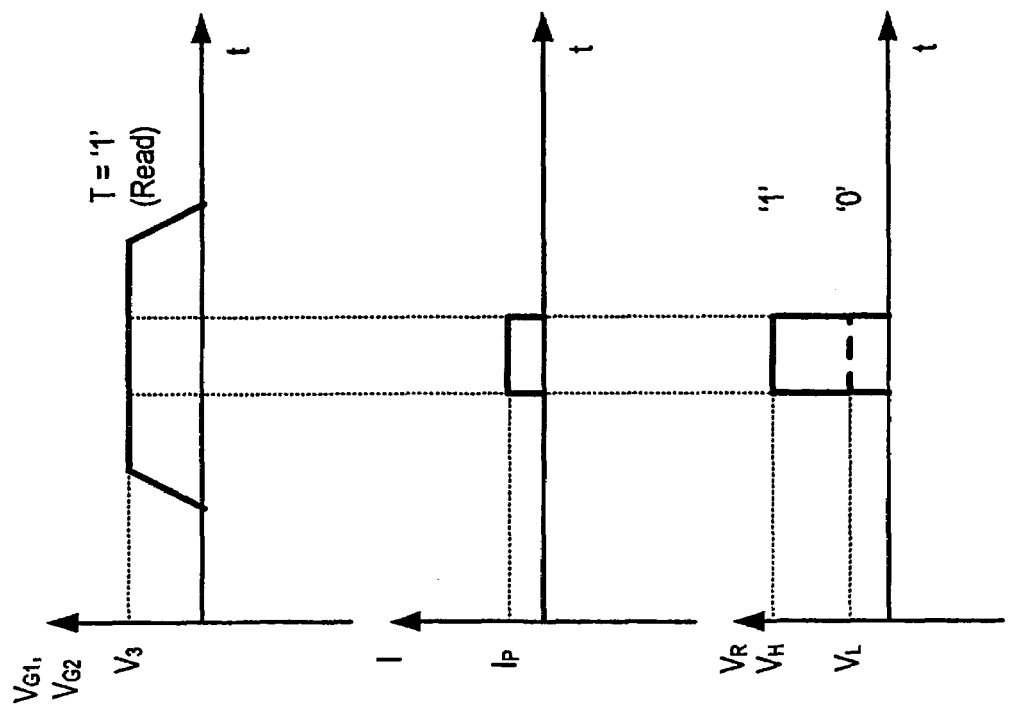
FIG. 13 illustrates gate biases and a current pulse which can be applied to the device of FIG. 1 during a read cycle.

Referring to FIG. 13, to switch the device 1 into a "read" state, an input T=1 is applied. This is achieved by supplying $V_{G1}=V_{G2}=V_1$ to the first and second gates 2, 3, as described earlier.

An output $V_R$ is read out by applying a current pulse having magnitude $I_P$ through the device 1 and measuring the bias $V_R$ across the device, as described earlier.

Referring to FIG. 14, a truth table for the device 1 is shown.

Logic 'AND' may be realised by resetting $V_R$ to '0' before writing A and B and measuring $V_R$. Logical 'NAND' may be achieved by resetting $V_R$ to '1' before writing A and B and measuring $V_R$. Logical 'CNOT' may be realised by writing A=1 and B=1.

Magnetic Random Access Memory Array

Referring to FIG. 15, a magnetic random access memory (MRAM) cell 55 in accordance with the present invention comprises an elongate conduction channel 56 and a gate 57. The memory cell 55 is similar to the conduction control device 1 described earlier except that the memory cell 55, as a building block, need not have a second fixed region 7, a second junction region 10, a corresponding junction gate 4 and a "coercivity tuning" gate 5. However, as will be described later in more detail, memory cells 55 may be arranged in a row in an alternating series of fixed and free regions with adjacent ferromagnetic regions decoupled by an intermediate junction region.

The channel 56 comprises ferromagnetic regions 58, 59 having relatively high and relatively low coercivity. The ferromagnetic regions 58, 59 are formed from the same ferromagnetic material in a patterned layer 67 (FIG. 17A). However, the ferromagnetic regions 58, 59 may be formed from different ferromagnetic materials, such as ferromagnetic metals and ferromagnetic semiconductors.

The channel 56 includes a junction region 60 which magnetically decouples the ferromagnetic regions 58, 59.

The junction region 60 is defined by a constriction 61 between a first sidewall 62 and a portion 63$_1$ of a second, opposing sidewall 63. In plan view, the second sidewall portion 63, provides an inward notch towards the first sidewall 24.

Figure 16:
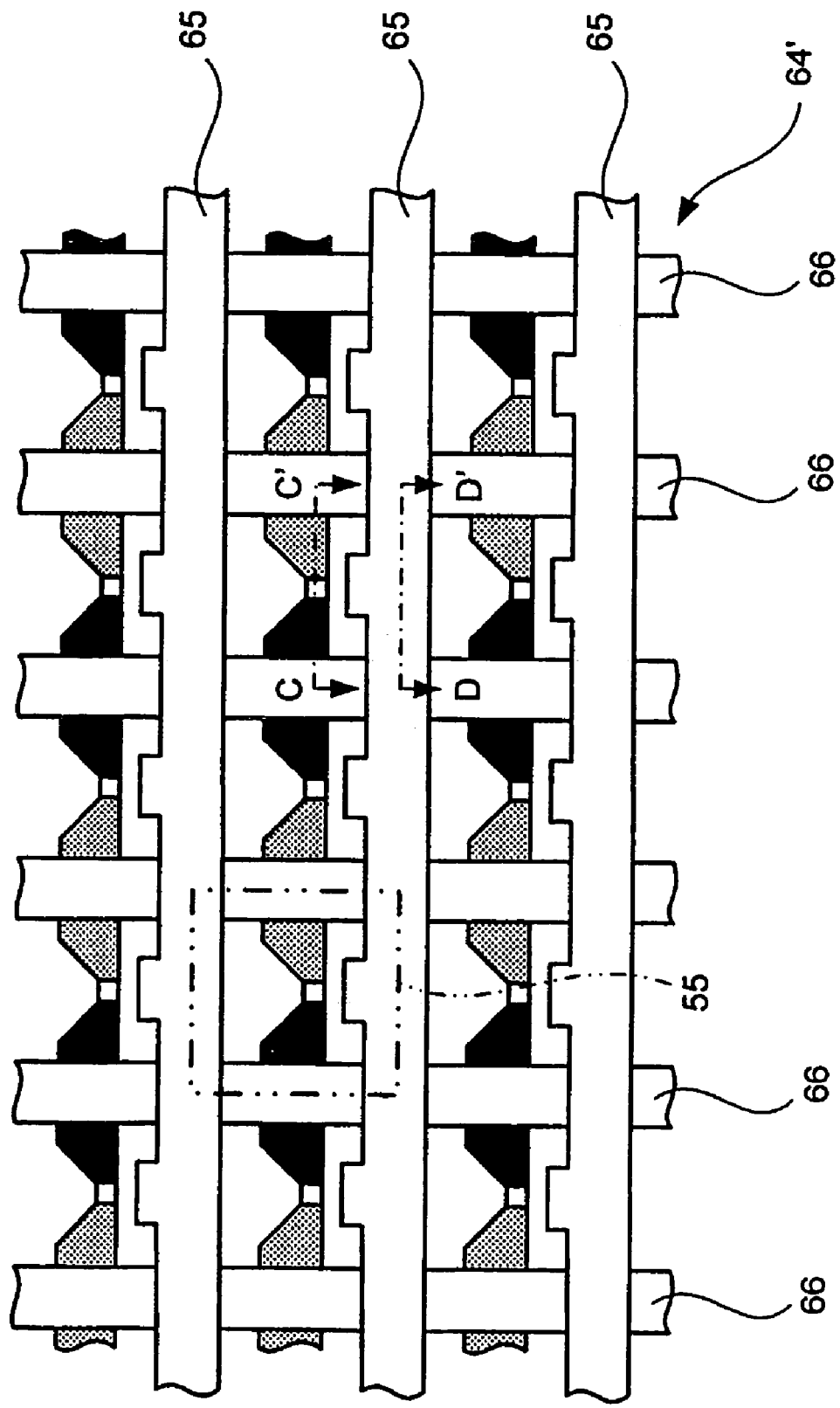
FIG. 16 illustrates a part of a memory array including the memory cell shown in FIG. 15.

Referring to FIG. 16, a portion 64' of a memory array 64 (FIG. 17) is shown.

The memory array 64' includes an array of memory cells 55. Each memory cell 55 has a unit cell size of $6F^2$, where F is feature size. Each cell 55 can be addressed through gate lines 65 and current lines 66.

Referring to FIG. 17A, the ferromagnetic and junction regions 58, 59, 60 are provided in a patterned ferromagnetic layer 67 comprising a ferromagnetic semiconductor, which in this example is a gallium manganese arsenide alloy ($Ga_{1-x}Mn_xAs$) having a manganese concentration x of 0.02, in other words $Ga_{0.98}Mn_{0.02}As$.

The patterned ferromagnetic layer 67 overlies a coextensive insulating layer 68 comprising an insulator, which in this example is aluminium arsenide (AlAs), although other insulators may be used. The insulator may latticed-matched or lattice mis-matched with the ferromagnetic semiconductor. The insulating layer 68 overlies a partially etched substrate 69 comprising semi-insulating gallium arsenide (GaAs). A capping layer 70 comprising AlAs overlies the patterned ferromagnetic layer 67.

The current line 66 comprises a conductor, such as metal or a heavily doped semiconductor. The current line 66 may be non-ferromagnetic. The current line 66, if it comprises a metal and if the ferromagnetic material is a semiconductor, may also serve as an ohmic contact. Processing may include annealing for forming an ohmic contact. In this example, the current line 66 comprises gold/zinc (Au/Zn) alloy, which serves as an ohmic contact to the $Ga_{0.98}Mn_{0.02}As$, and an overlying gold layer (Au). The gold/zinc layer has a thickness of 50 nm and the gold has a thickness of 200 nm. However, other layer thicknesses may be used.

Referring to FIG. 17B, the gate and current lines 65, 66 are electrically insulated by means of an intermediate insulating layer 71. The intermediate insulating layer 71 may be crystalline or amorphous. In this example, the insulating layer 71 comprises silicon dioxide ($SiO_2$). However, other insulating materials may be used, such as silicon nitride ($Si_3N_4$). The insulating layer 71 is deposited before the gate line 65.

The gate line 65 comprises a conductor, such as metal or a heavily doped semiconductor. The gate line 65 may be non-ferromagnetic. In this example, the gate 65 comprises titanium (Ti) sticking layer and an overlying gold layer (Au). The titanium has a thickness of 20 nm and the gold has a thickness of 200 nm. However, other layer thicknesses may be used.

The memory array 64 may be configured differently to that shown in FIGS. 16, 17A and 17B. For example, the gate line 65 may be formed in plane with the patterned ferromagnetic layer 67, such as being formed from the same ferromagnetic material as the patterned ferromagnetic layer 67 in a similar way to the device 1 (FIG. 1) described earlier. The current line 66 may be formed over the gate line 65, particularly if the gate line 65 is formed in plane with the patterned ferromagnetic layer 67. As described earlier, a surface or underlying gate configuration may be used instead of a side gate configuration.

Alternatively, the current line 66 may be formed under the ferromagnetic layer 67, for example by depositing a conductive layer (not shown) on the insulating layer 68, patterning the layer (not shown) into stripes (not shown) and depositing a ferromagnetic layer over the stripes (not shown) of conductive and insulating material. The ferromagnetic layer is then patterned to form patterned layer 67 and the gate lines 66 are defined. Patterning of the ferromagnetic layer and defining the gate lines may occur at the same or different processing steps.

Referring to FIG. 18, the memory array 64 is controlled by a row decoder 72 and a column decoder 73.

The row decoder 72 can select a gate line from gate lines $65_1$, $65_{i-1}$, $65_i$, $65_{i+1}$, $65_n$ to address a row of memory cells from memory cells $55_{1,1}$, $55_{1,j-2}$, $55_{1,j-1}$, $55_{1,j}$, $55_{1,j+1}$, $55_{1,j+2}$, $55_{1,m}$, $55_{i-1,1}$, $55_{i-1,j-2}$, $55_{i-1,j-1}$, $55_{i-1,j}$, $55_{i-1,j+1}$, $55_{i-1,j+2}$, $55_{i-1,m}$, $55_{i,1}$, $55_{i,j-2}$, $55_{i,j-1}$, $55_{i,j}$, $55_{i,j+1}$, $55_{i,j+2}$, $55_{i,m}$, $55_{i+1,1}$, $55_{i+1,j-2}$, $55_{i+1,j-1}$, $55_{i+1,j}$, $55_{i+1,j+1}$, $55_{i+1,j+2}$, $55_{i+1,m}$, $55_{n,1}$, $55_{n,j-2}$, $55_{n,j-1}$, $55_{n,j}$, $55_{n,j+1}$, $55_{n,j+2}$, $55_{n,m}$ and apply a selection signal at a bias $V_L$, $V_M$ or $V_H$ for selecting three different channel conduction regimes.

A selection signal having a bias $V_L$ increases charge carrier density in the junctions regions 60, thus reducing the resistance of the junctions regions 60 so that they conduct, preferably as ohmic conductors. A selection signal having a bias $V_M$ decreases charge carrier density in the junctions regions 60 so that the junctions regions 60 are depleted. A selection signal having a bias $V_H$ decreases charge carrier density in the junctions regions 60 so that the junctions regions 60 are strongly depleted, i.e. the depletion region when bias $V_H$ is applied is larger than the depletion region when $V_M$ is applied. $V_M$ and $V_H$ are of opposite polarity to $V_L$. As explained earlier, values can be found by routine experiment.

The column decoder 73 can select a pair of adjacent current lines from current lines $66_1$, $66_2$, $66_{j-2}$, $66_{j-1}$, $66_j$, $66_{j+1}$, $66_{j+2}$, $66_{j+3}$, $66_m$, $66_{m+1}$ for driving write current pulse having a magnitude $|I_H|$ which higher than the critical current for the lower coercivity ferromagnetic region 59, but below the critical current for the higher coercivity ferromagnetic region 58, or a read current pulse having a magnitude $|I_M|$ which is below the critical current for the lower coercivity ferromagnetic region 59. A '0' or a '1' is written according to the polarity of the write current pulse.

Figure 19:
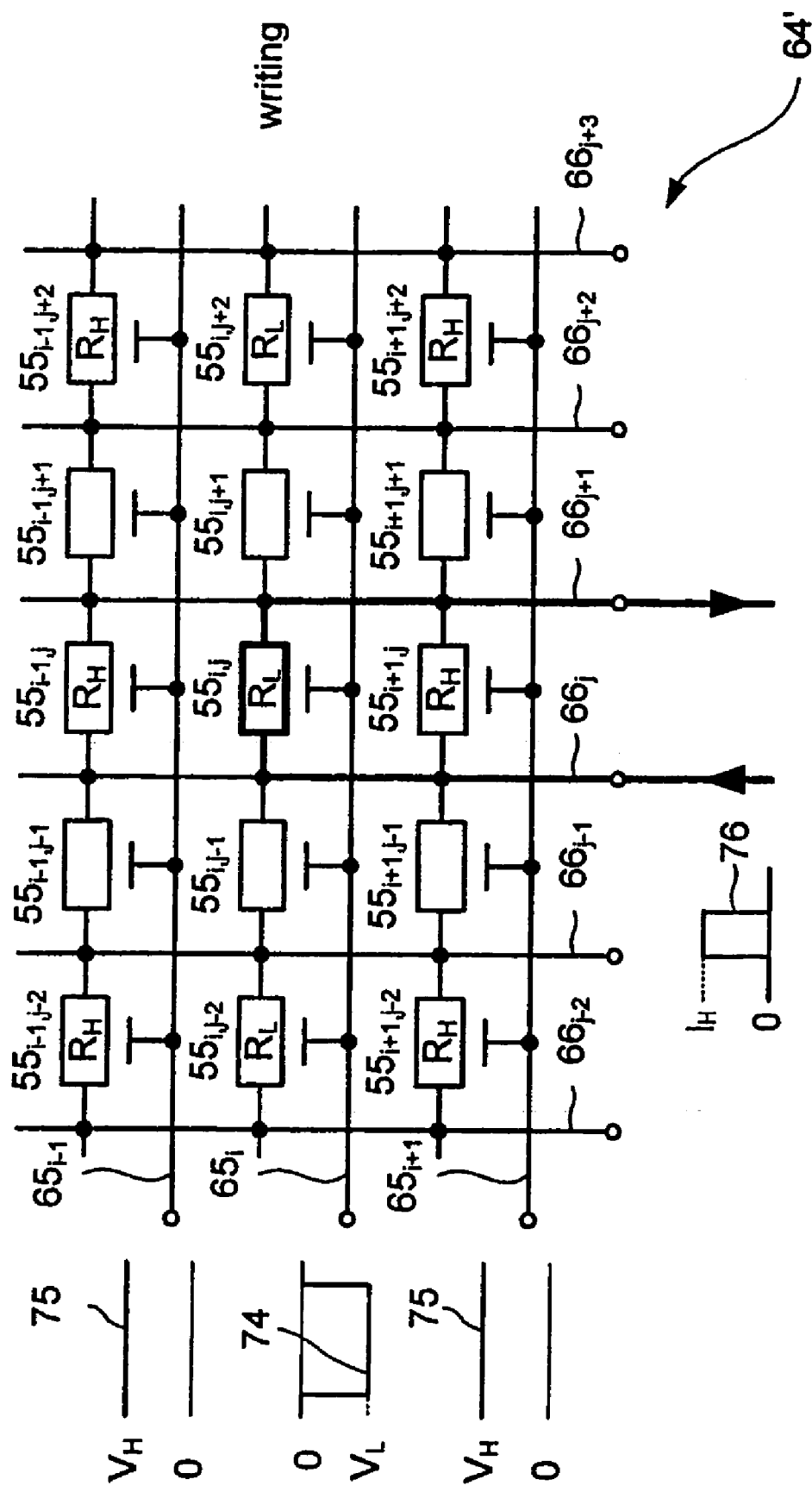
FIG. 19 illustrates writing to a memory cell in the memory array shown in FIG. 18.

Referring to FIG. 19, the portion 64' of the memory array 64 during a write process is illustrated.

A write selection signal 74 having a bias $V_L$ is applied to row i, namely gate line $65_i$, while hold signals 75 having a bias $V_H$ is applied to other rows, including gate lines $65_{i-1}$, $65_{i+1}$. Thus, junctions 60 of memory cells $55_{i,j-1}$, $55_{i,j}$, $55_{i,j+1}$ in row i have lower resistance, whereas junctions 60 of memory cells $55_{i-1,j-1}$, $55_{i-1,j}$, $55_{i-1,j+1}$, $55_{i+1,j-1}$, $55_{i+1,j}$, $55_{i+1,j+1}$ in other rows i−1, i+1 have higher resistance.

A write current pulse 76 is driven through columns j and j+1, namely current lines $66_j$, $66_{j+1}$. The current pulse 76 passes through memory cell $55_{i,j}$ with a sufficiently high current density to set magnetisation. Other memory cells $55_{i-1,j}$, $55_{i+1,j}$ in the same column j are not set since the junctions 60 in these devices are in a high resistance state. As explained earlier, the write current pulse 76 may have a duration of less than 100 ns, 10 ns or 1 ns. In this example, the duration is about 1 ns.

Figure 20:
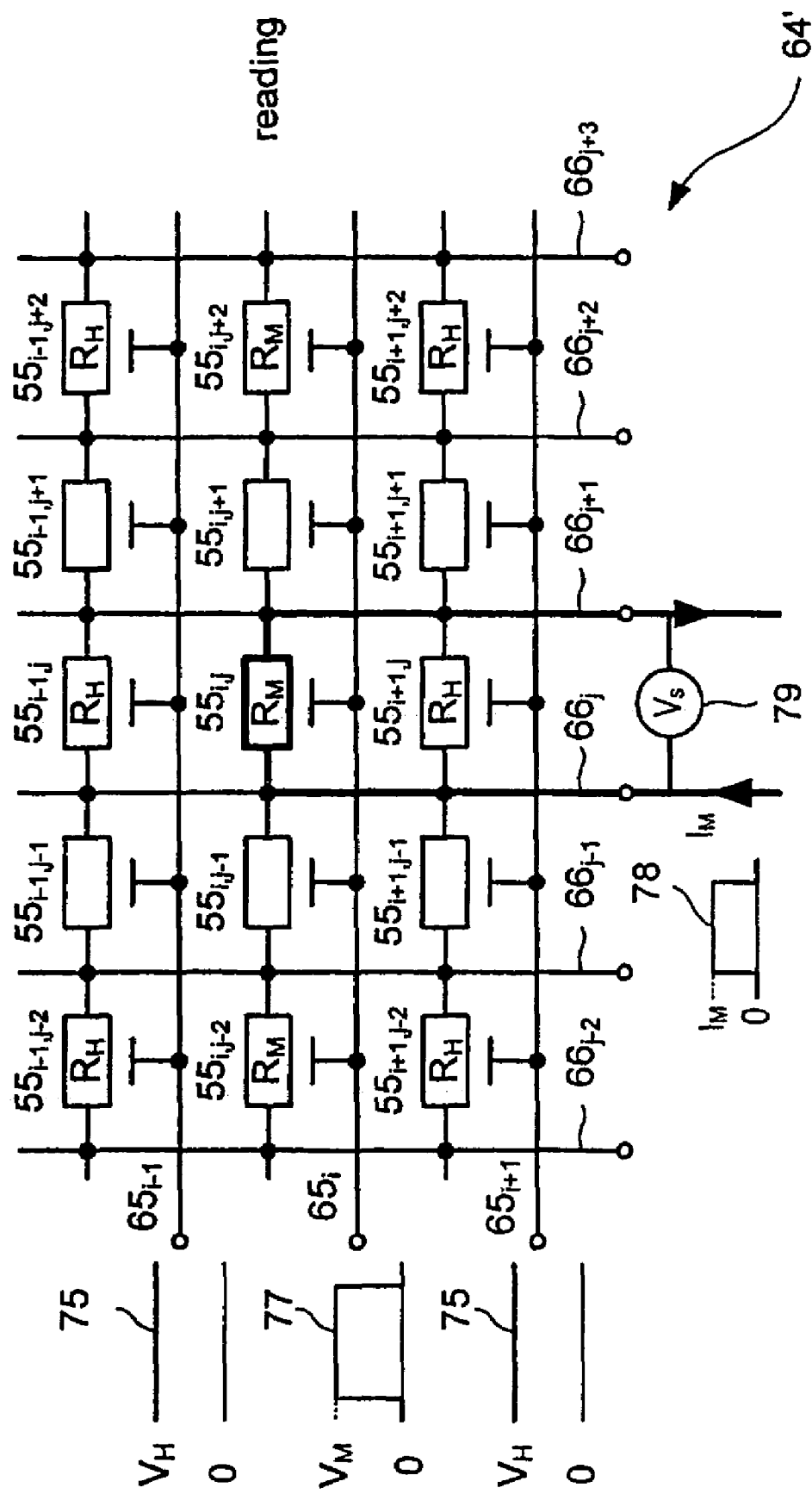
FIG. 20 illustrates reading a memory cell in the memory array shown in FIG. 18.

Referring to FIG. 20, the portion 64' of the memory array 64 during a read process is illustrated.

A read selection signal 77 having a bias $V_M$ is applied to row i, namely gate line $65_i$, while hold signals 75 having a bias $V_H$ is still applied to other rows, including gate lines $65_{i-1}$, $65_{i+1}$. Thus, junctions 60 of memory cells $55_{i,j-1}$, $55_{i,j}$, $55_{i,j+1}$ in row i have lower resistance, whereas junctions 60 of memory cells $55_{i-1,j-1}$, $55_{i-1,j}$, $55_{i-1,j+1}$, $55_{i+1,j-1}$, $55_{i+1,j}$, $55_{i+1,j+1}$ in other rows i−1, i+1 have higher resistance.

A read current pulse 78 is driven through columns j and j+1, namely current lines $66_j$, $66_{j+1}$. The current pulse 74 passes through memory cell $55_{i,j}$ with a sufficiently high current density to set magnetisation. Other memory cells $55_{i-1,j}$, $55_{i+1,j}$ in the same column j are not set since the junctions 60 in these devices are in a high resistance state.

The voltage $V_s$ developed across the current lines $66_j$, $66_{j+1}$ is measured by the column decoder 73 (FIG. 18) to determine whether the cell is in a high resistance state, for example corresponding to '0' or a low resistance state corresponding to '1'.

It will be appreciated that many modifications may be made to the embodiments hereinbefore described. The device need not be a lateral device as described earlier, but can be a vertical device, such as a pillar.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A conduction control device comprising:
   a first ferromagnetic region having relatively high coercivity;
   a second ferromagnetic region having relatively low coercivity;
   a junction region disposed between the first and second ferromagnetic regions for magnetically decoupling said first and second ferromagnetic regions; and
   a gate for applying an electric field to the junction region so as to control charge carrier density within the junction region.

2. A device according to claim 1, comprising:
   a third ferromagnetic region having higher coercivity than the second ferromagnetic region;
   another junction region disposed between the second and third ferromagnetic regions; and
   another gate for applying an electric field to the other junction region so as to change charge carrier density within the junction region.

3. A device according to claim 1, further comprising:
   a further gate for applying a field to the second ferromagnetic region.

4. A device according to claim 1, wherein the first and second ferromagnetic regions comprise the same material.

5. A device according to claim 1, wherein the first and second ferromagnetic regions and the junction region comprise the same material.

6. A device according to claim 1, wherein the first and second ferromagnetic regions and the junction region are formed in a layer.

7. A device according to claim 1, wherein the first and second ferromagnetic regions comprise ferromagnetic semiconductor.

8. A device according to claim 7, wherein the ferromagnetic semiconductor comprises (Ga,Mn)As.

9. A device according to claim 1, wherein the junction region comprises a semiconductor material.

10. A device according to claim 1, wherein the first ferromagnetic region is elongate and has a longitudinal axis.

11. A device according to claim 10, wherein the longitudinal axis is aligned in a direction along an easy magnetic axis.

12. A device according to claim 1, wherein the device is configured to exhibit tunnelling anisotropy magnetoresistance (TAMR) effect.

13. A device according to claim 1, wherein the device is configured to exhibit tunnelling magnetoresistance (TMR) effect.

14. A device according to claim 1, wherein the second ferromagnetic region is provided by a layer or a portion of a layer which is arranged substantially in a plane.

15. A device according to claim 1, wherein the layer or layer portion has a thickness less than or equal to 10 nm.

16. A device according to claim 14, wherein the second ferromagnetic region has a magnetic easy axis which is orientated out of the plane of the layer or layer portion.

17. A device according to claim 14, wherein the second ferromagnetic region has a magnetic easy axis which is orientated in the plane of the layer or layer portion.

18. A device according to claim 14, wherein the first ferromagnetic region is provided by another layer or another portion of the layer which is arranged substantially in the, or another, plane.

19. A device according to claim 18, wherein the first ferromagnetic region has a magnetic easy axis which is orientated in the plane of the other layer or the other layer portion.

20. A device comprising:
   a conductive region;
   a ferromagnetic region;
   a junction region connecting the conductive regions and the ferromagnetic region; and
   a gate for applying an electric field to the junction region so as to control charge carrier density within the junction region.

21. A device according to claim 20, wherein the conductive region comprises a non-ferromagnetic material.

22. A device according to claim 20, wherein the conductive region comprises a semiconductor material.

23. A device according to claim 20, wherein the conductive region comprises a semiconductor material.

24. A device according to claim 20, wherein the junction region comprises a semiconductor material.

25. A device according to claim 20, wherein the conductive region and junction region comprise the same material.

26. A device according to claim 20, wherein the ferromagnetic region and junction region comprise the same material.

27. A memory array of devices according to claim 1.

28. A method of operating a conduction control device having a channel comprising a first ferromagnetic region having relatively high coercivity, a second ferromagnetic region having relatively low coercivity, a junction region disposed between the first and second ferromagnetic regions for magnetically decoupling said first and second ferromagnetic regions; and a gate for applying a field to the junction region so as to control charge carrier density within the junction region, the method comprising:
   applying a first bias tote gate for increasing charge carrier density in the junction region; and
   driving a first current pulse through the channel, said current pulse having a first current amplitude greater than a critical value for reversing magnetisation of the second ferromagnetic region.

29. A method according to claim 28, comprising:
   applying a second bias to the gate for decreasing charge carrier density in the junction region; and
   driving a second current pulse through the channel, said second current pulse having a second current amplitude lower than the critical value.

30. A method of operating a conduction control device having a channel comprising a first ferromagnetic region having relatively high coercivity, a second ferromagnetic region having relatively low coercivity, a junction region disposed between the first and second ferromagnetic regions for magnetically decoupling said first and second ferromagnetic regions; and a gate for applying a field to the junction region so as to control charge carrier density within the junction region, the method comprising:
   applying a magnetic field to said first and second ferromagnetic regions for reversing magnetization of the second, but not the first, ferromagnetic region, said magnetic field being greater than a critical field of the second ferromagnetic region, but lower than a critical field of the first ferromagnetic region.

* * * * *